(12) United States Patent (10) Patent No.: US 12,635,278 B2
Kodama (45) Date of Patent: May 19, 2026

(54) IMAGING DEVICE, METHOD OF MANUFACTURING IMAGING DEVICE, AND ELECTRONIC APPARATUS

(71) Applicant: SONY SEMICONDUCTOR SOLUTIONS CORPORATION, Kanagawa (JP)

(72) Inventor: Yoshinori Kodama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 792 days.

(21) Appl. No.: 17/755,851

(22) PCT Filed: Nov. 9, 2020

(86) PCT No.: PCT/JP2020/041674
§ 371 (c)(1),
(2) Date: May 10, 2022

(87) PCT Pub. No.: WO2021/100509
PCT Pub. Date: May 27, 2021

(65) Prior Publication Data
US 2022/0392938 A1 Dec. 8, 2022

(30) Foreign Application Priority Data
Nov. 18, 2019 (JP) ................................. 2019-208122

(51) Int. Cl.
H01L 27/146 (2006.01)
G02B 5/18 (2006.01)
(Continued)

(52) U.S. Cl.
CPC ......... H10F 39/806 (2025.01); H10F 39/024 (2025.01); H10F 39/805 (2025.01); H10F 39/184 (2025.01); H10F 39/199 (2025.01)

(58) Field of Classification Search
CPC .. H10F 39/014; H10F 39/806; H10F 39/8063; H01L 21/0243
See application file for complete search history.

(56) References Cited

U.S. PATENT DOCUMENTS 10,243,015 B1 3/2019 Wang et al.
2004/0257460 A1* 12/2004 Kuriyama ......... H01L 27/14621
348/340
(Continued)

FOREIGN PATENT DOCUMENTS

CN 105229790 A 1/2016
CN 107615483 A 1/2018
(Continued)

OTHER PUBLICATIONS

International Search Report and Written Opinion of PCT Application No. PCT/JP2020/041674, issued on Feb. 2, 2021, 11 pages of ISRWO.

*Primary Examiner* — Kretelia Graham
*Assistant Examiner* — David J Goodwin
(74) *Attorney, Agent, or Firm* — CHIP LAW GROUP

(57) ABSTRACT

To provide an imaging device that suppresses reflection of incident light still more effectively and has excellent sensitivity characteristics. This imaging device includes a semiconductor substrate and a photoelectric conversion section. The semiconductor substrate includes a multi-stepped recess in which a plurality of respective holes defined by first outlines having substantially polygonal shapes is continuous in a thickness direction. The substantially polygonal shapes extend along a first surface orthogonal to the thickness direction and are different from each other in size in a plan view taken along the thickness direction. The photoelectric conversion section generates electric charge through photoelectric conversion. The photoelectric conversion section is defined by a second outline including a portion inclined with (Continued)

respect to the first outlines of the holes in a plan view. The electric charge corresponds to an amount of incident light passing through the multi-stepped recess.

9 Claims, 29 Drawing Sheets

(51) Int. Cl.
　　*H10F 39/00* 　　　(2025.01)
　　*H10F 39/12* 　　　(2025.01)
　　*H10F 39/18* 　　　(2025.01)

(56) References Cited

U.S. PATENT DOCUMENTS

| | | | | |
|---|---|---|---|---|
| 2014/0002700 A1* | 1/2014 | Oishi | ............... | H04N 25/134 |
| | | | | 438/70 |
| 2016/0112614 A1 | 4/2016 | Masuda et al. | | |

| | | | | |
|---|---|---|---|---|
| 2018/0158857 A1 | 6/2018 | Oshiyama et al. | | |
| 2019/0148434 A1* | 5/2019 | Hsu | ............... | H10F 39/8057 |
| | | | | 257/432 |
| 2020/0075656 A1* | 3/2020 | Lee | ............... | G02B 5/1866 |
| 2023/0253434 A1* | 8/2023 | Wu | ............... | H10F 39/014 |
| | | | | 257/443 |

FOREIGN PATENT DOCUMENTS

| | | | |
|---|---|---|---|
| CN | 110047855 A | 7/2019 |
| JP | 2009-198626 A | 9/2009 |
| JP | 2012-208257 A | 10/2012 |
| JP | 2013-033864 A | 2/2013 |
| JP | 2015-029054 A | 2/2015 |
| JP | 2018-088532 A | 6/2018 |
| KR | 10-2016-0029735 A | 3/2016 |
| TW | 201933594 A | 8/2019 |
| WO | 2015/001987 A1 | 1/2015 |
| WO | 2016/065024 A1 | 4/2016 |
| WO | 2016/194654 A1 | 12/2016 |
| WO | 2019/138923 A1 | 7/2019 |

* cited by examiner

[FIG. 1]
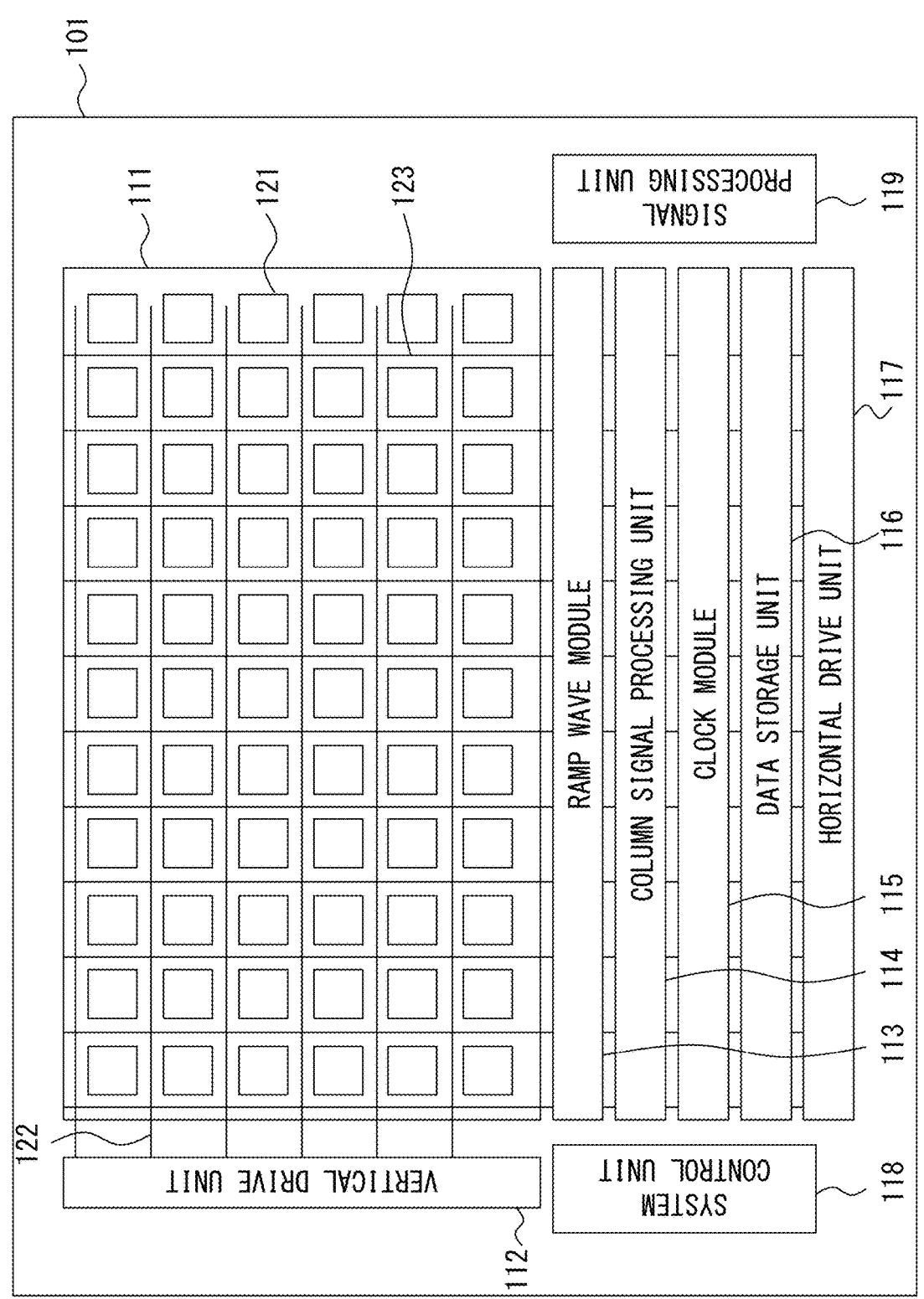

[FIG. 2]
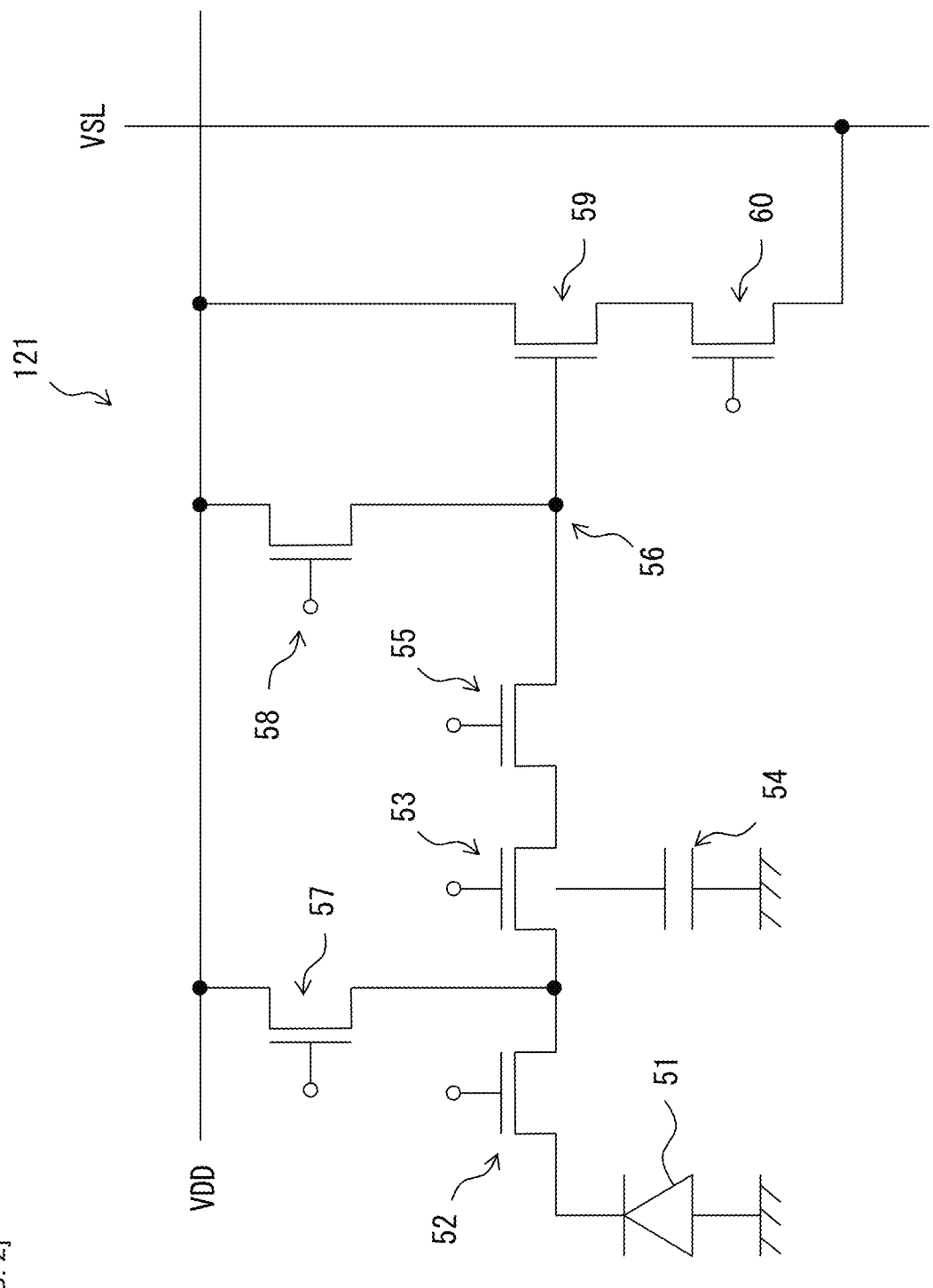

[FIG. 3]
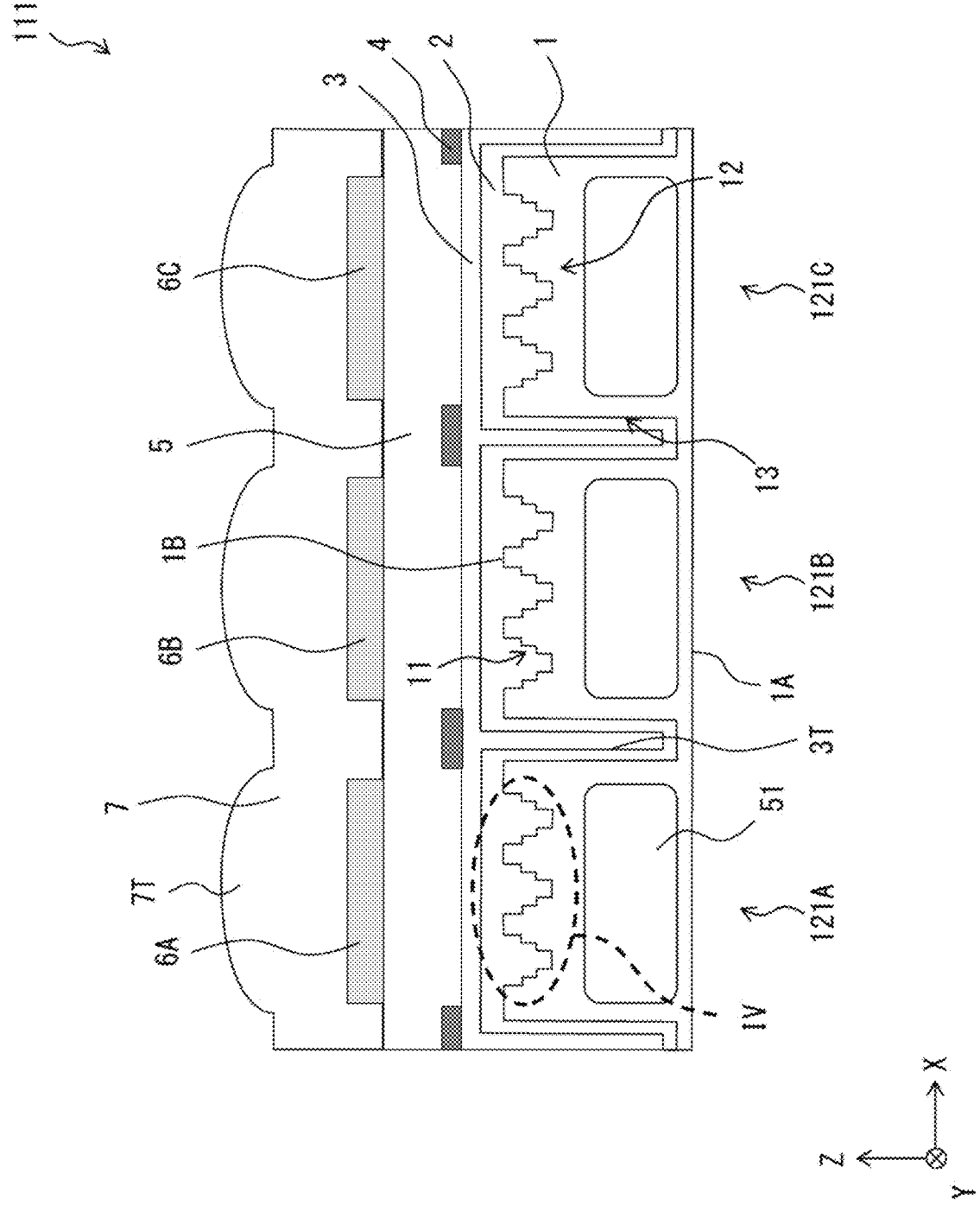

[FIG. 4]
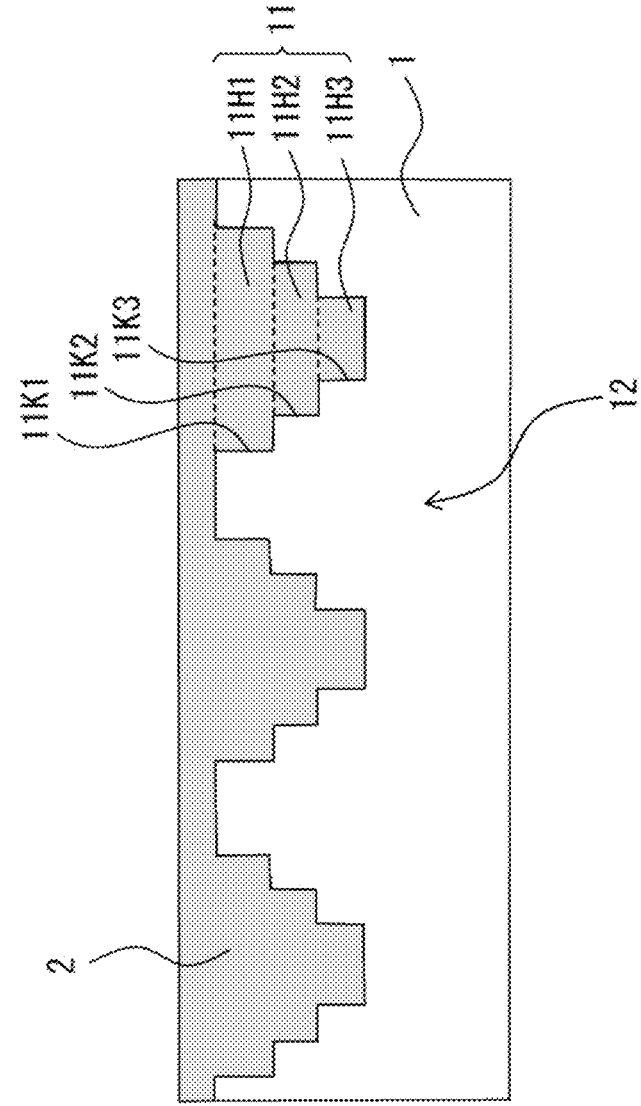
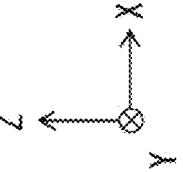

[FIG. 5]
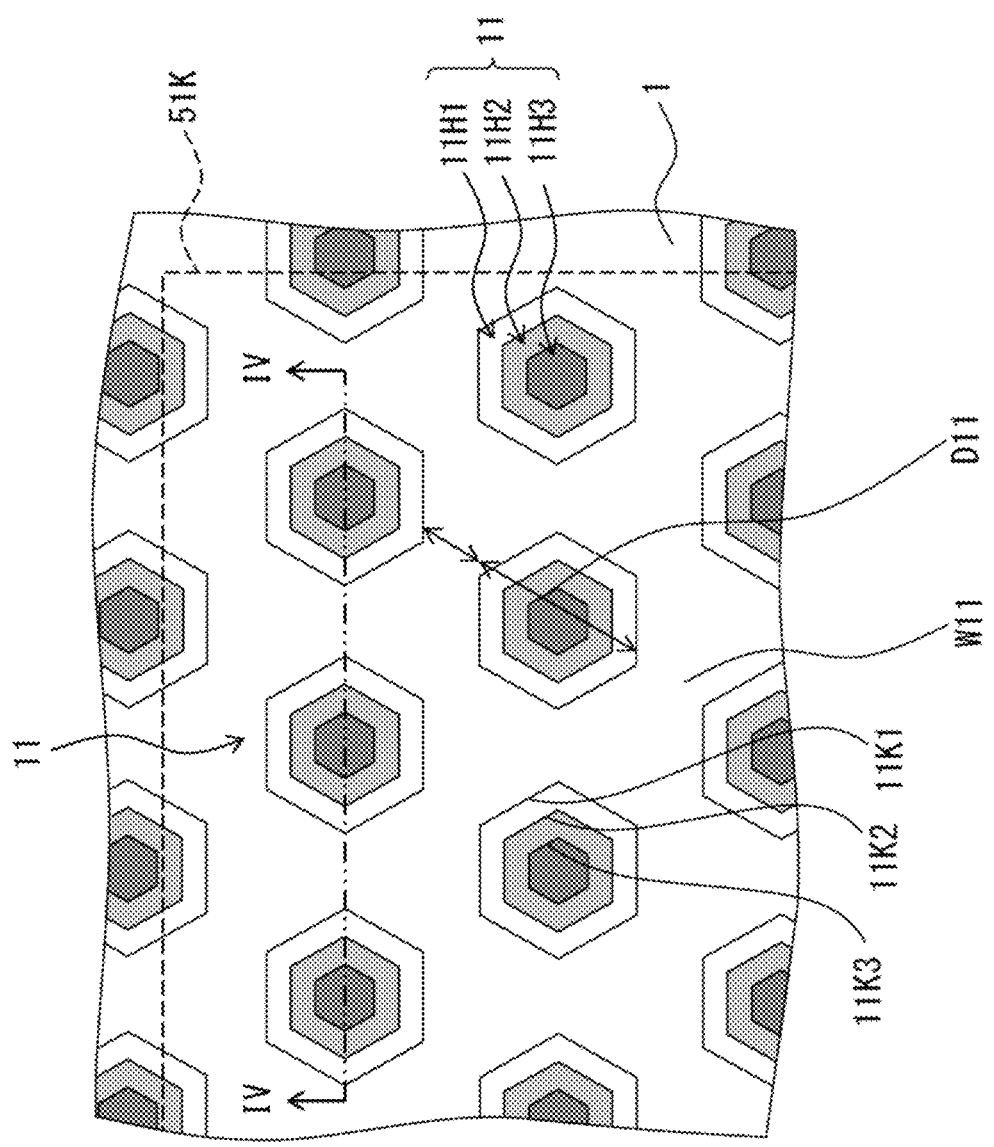
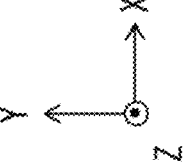

[FIG. 6A]
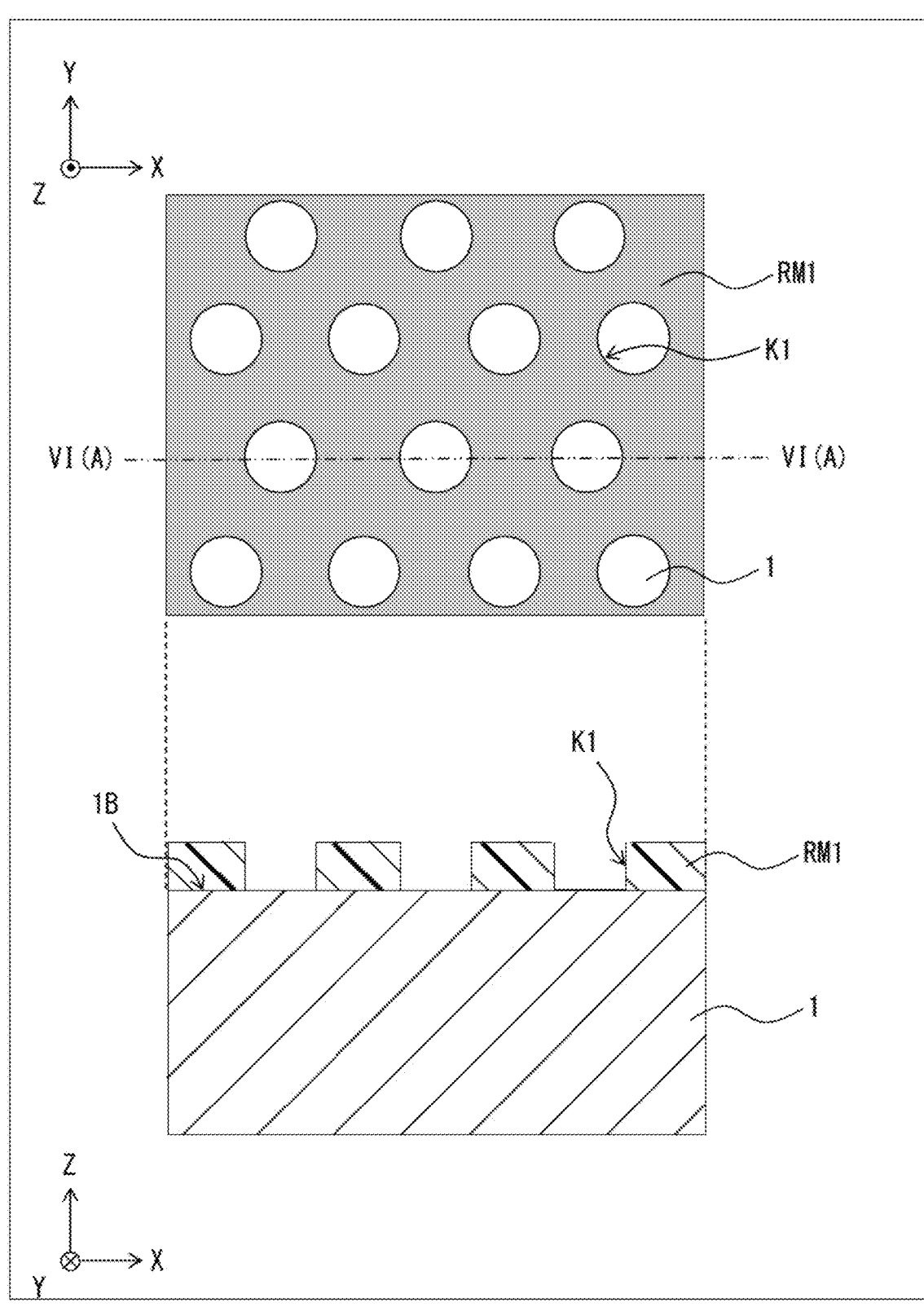

[FIG. 6B]
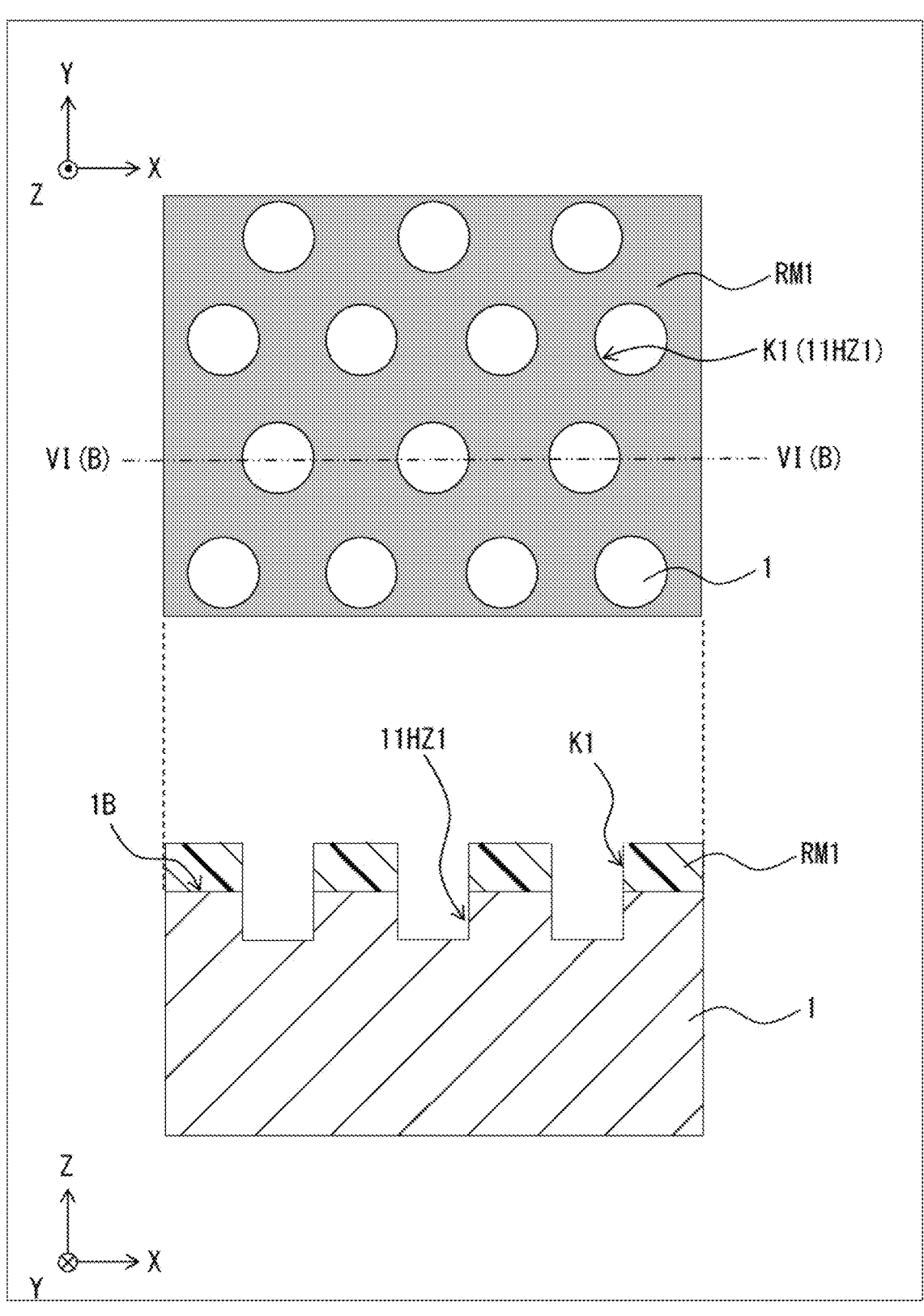

[FIG. 6C]
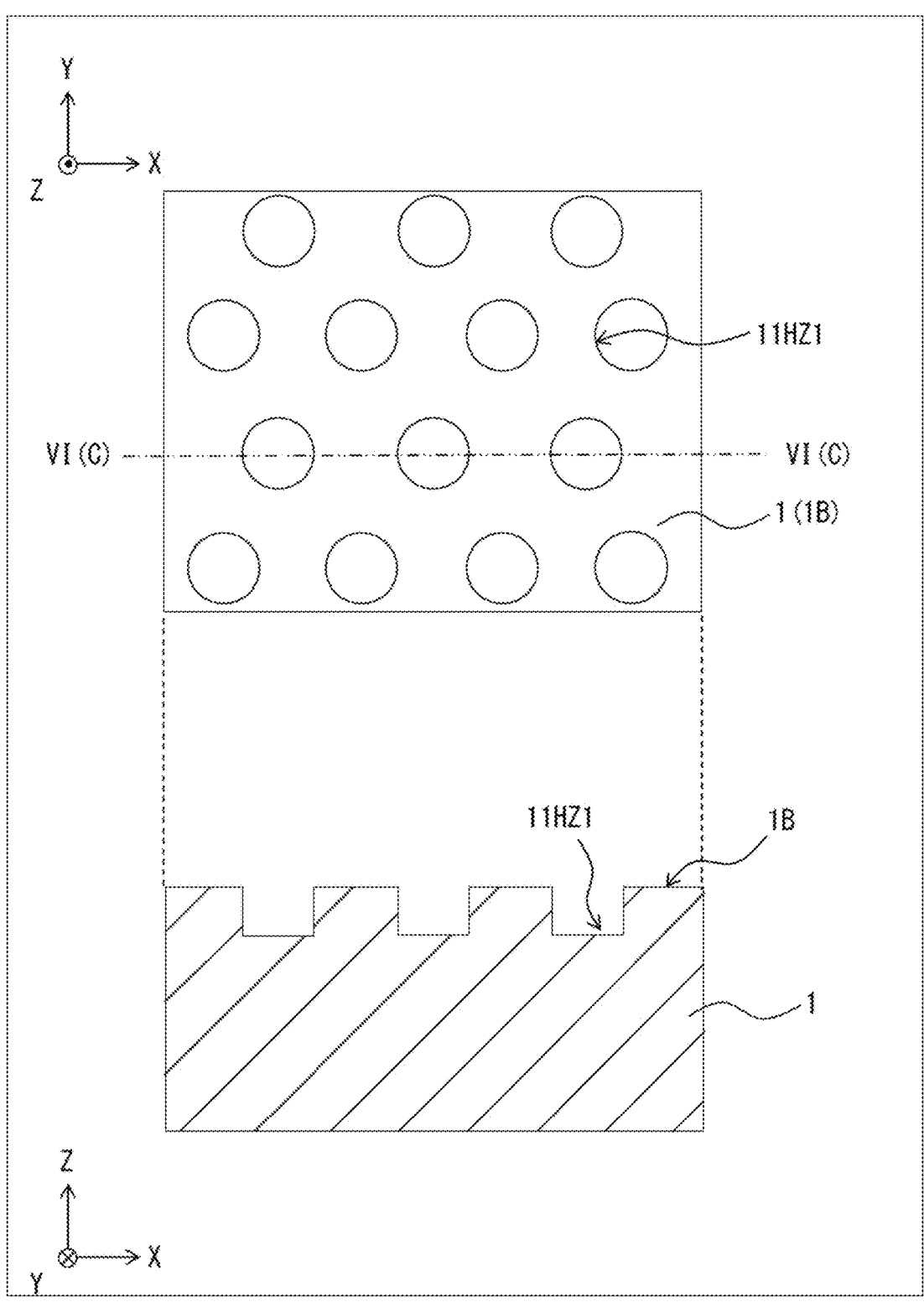

[FIG. 6D]
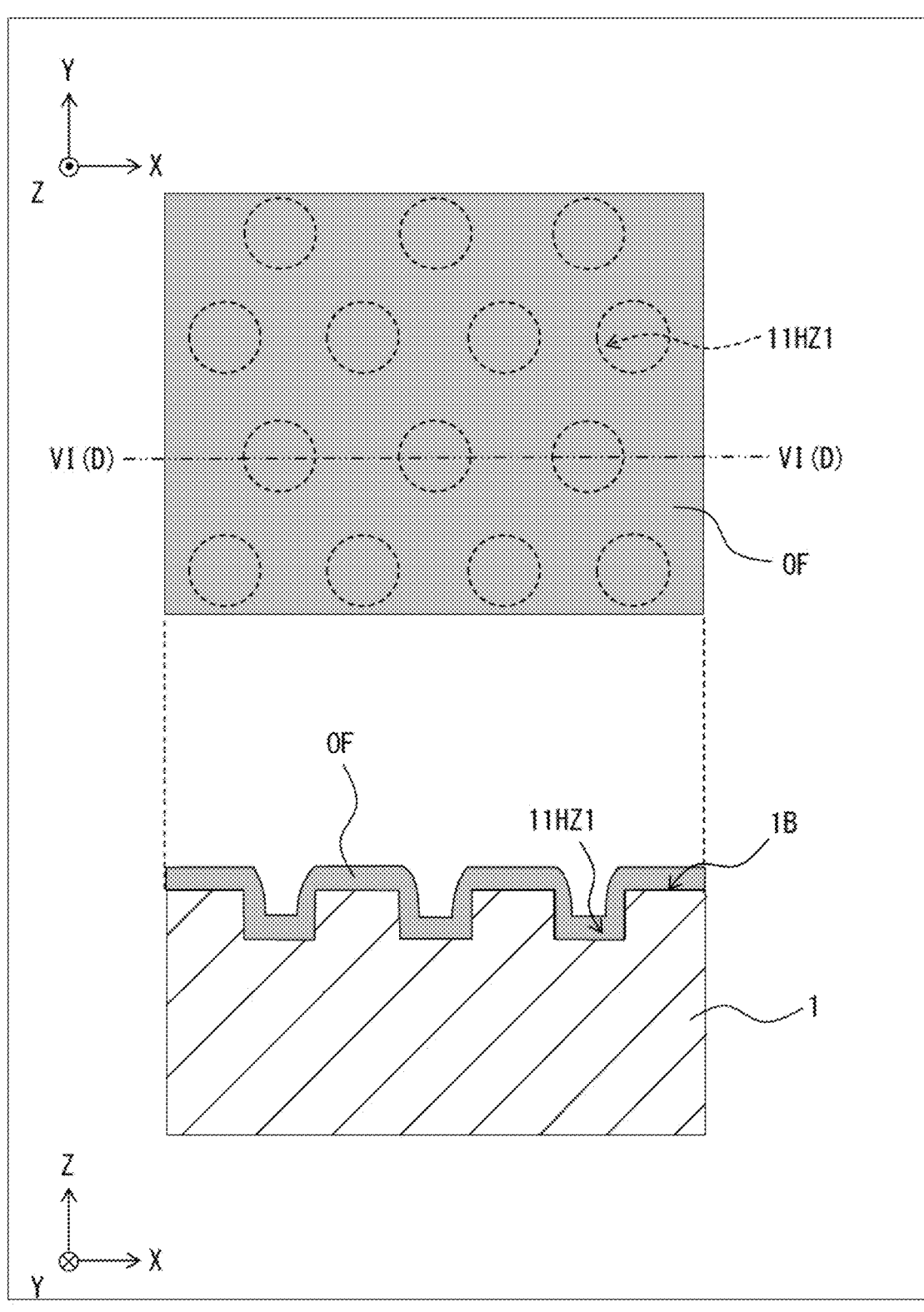

[FIG. 6E]
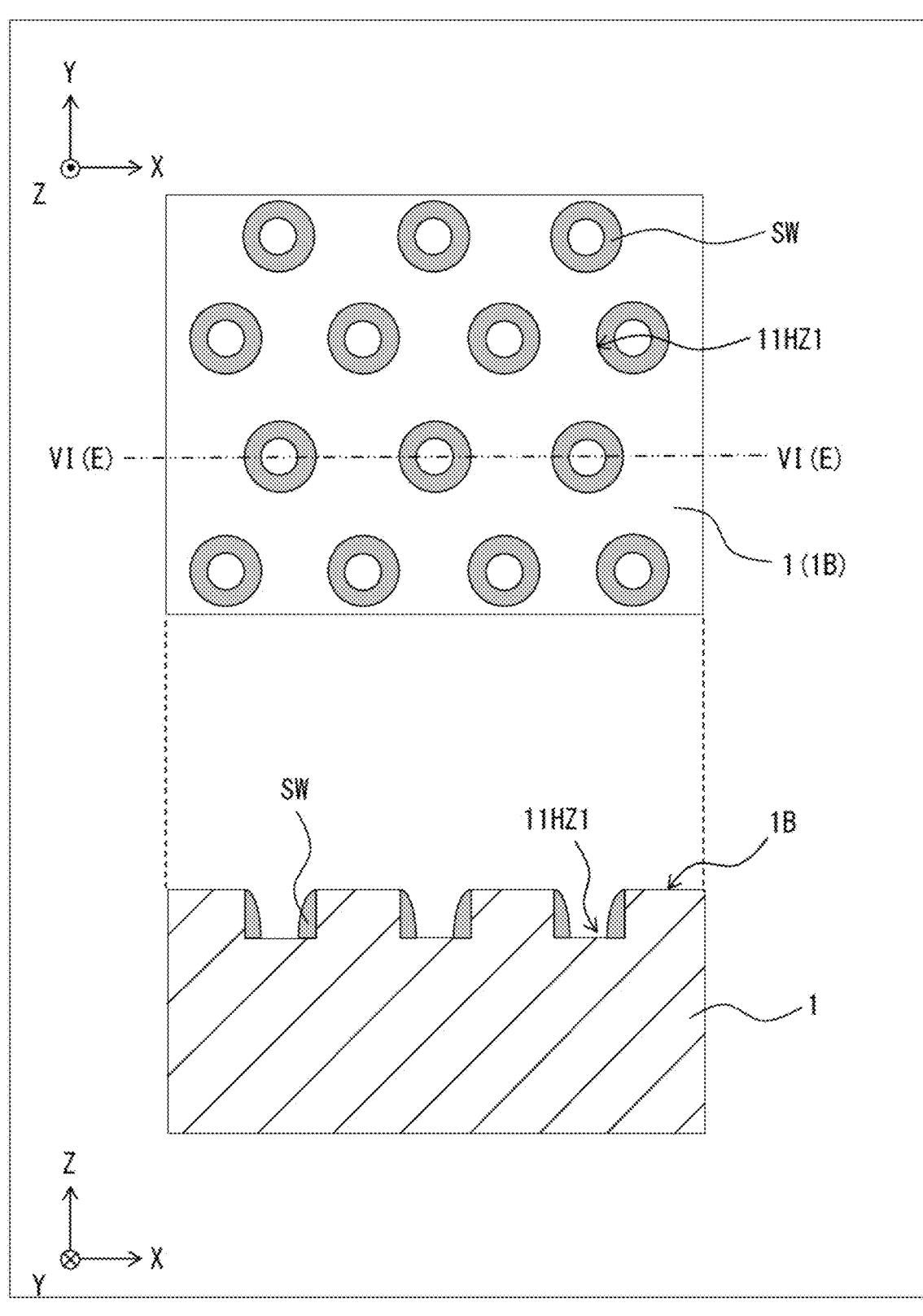

[FIG. 6F]
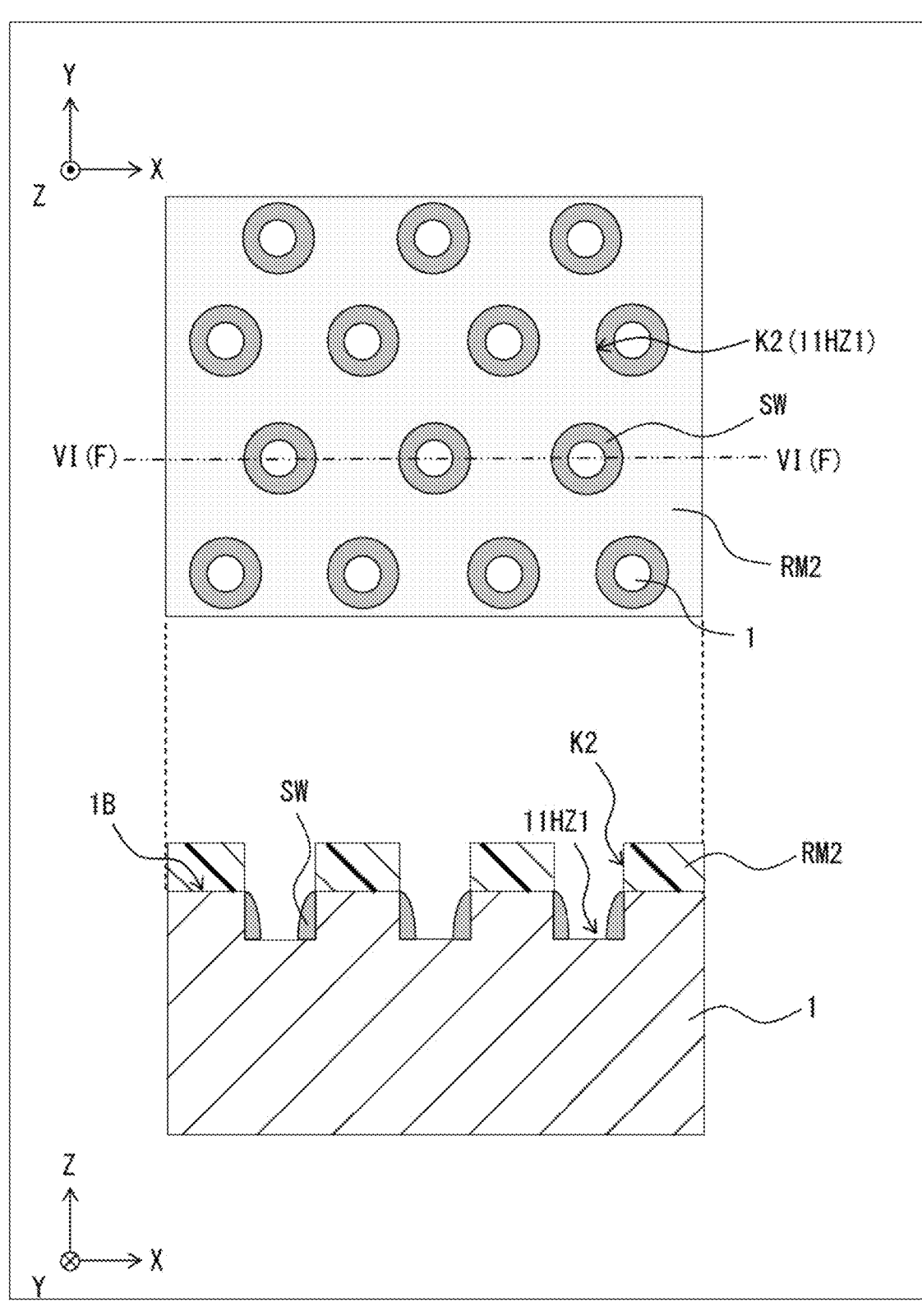

[FIG. 6G]
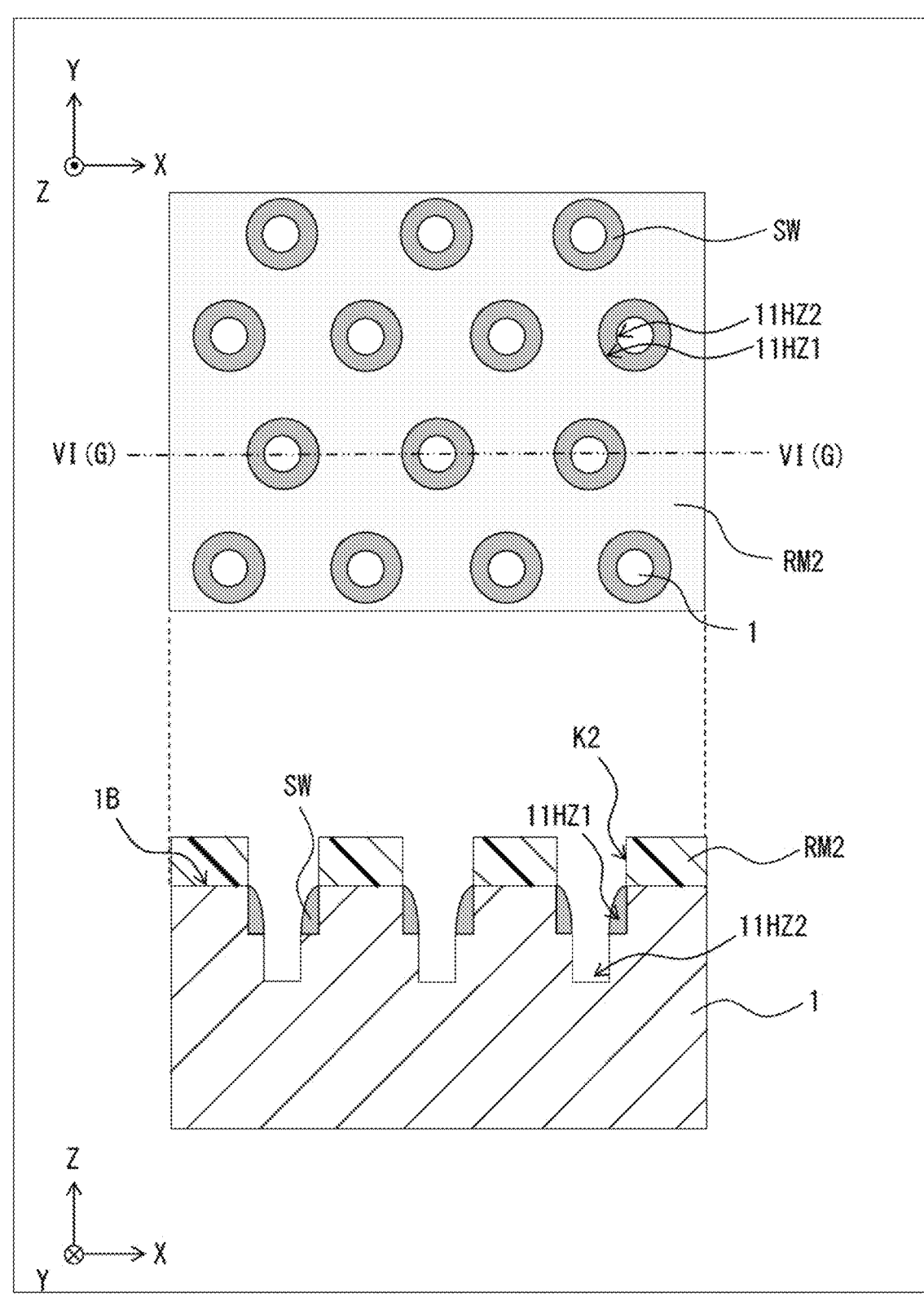

[FIG. 6H]
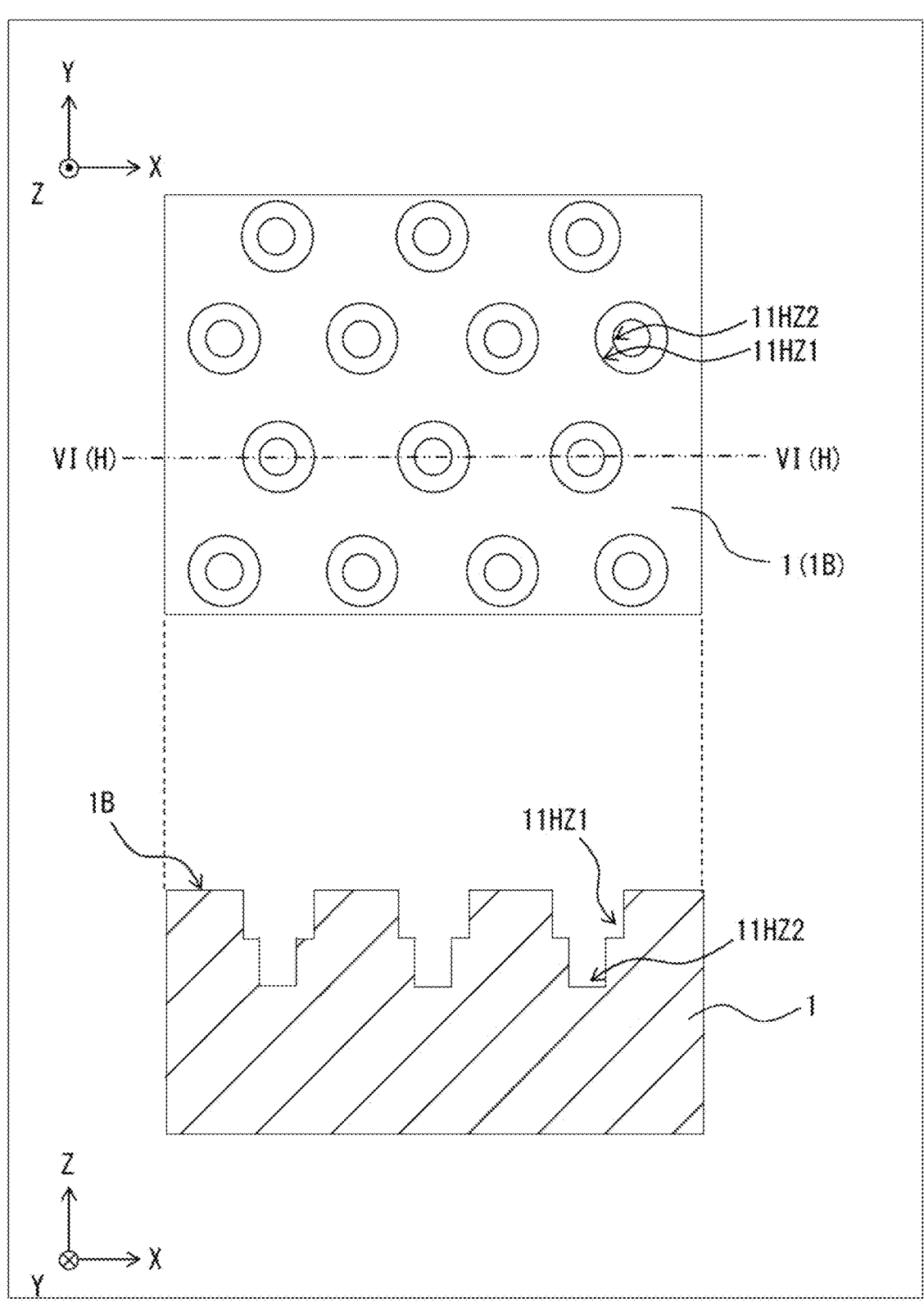

[FIG. 6I]
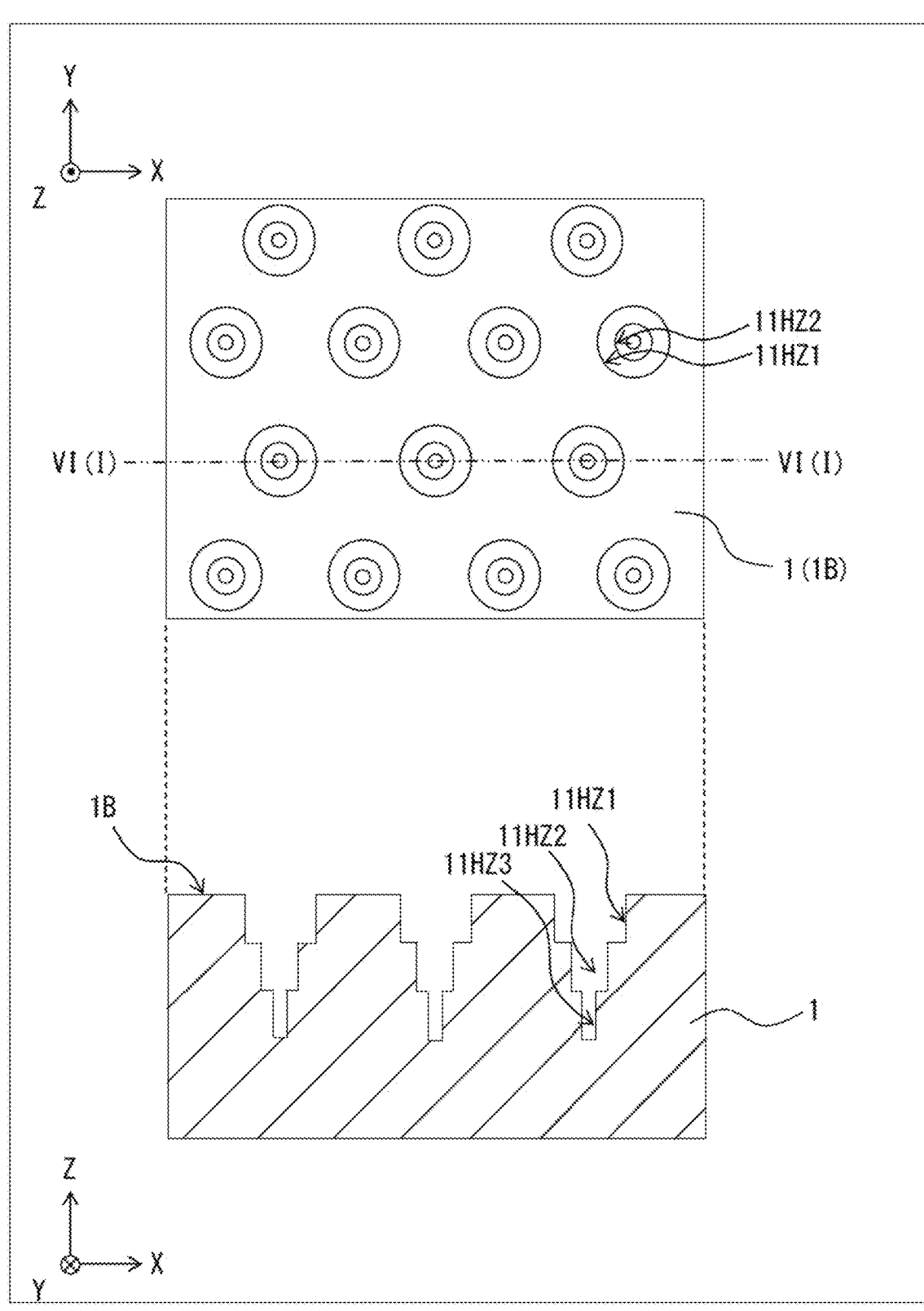

[FIG. 6J]
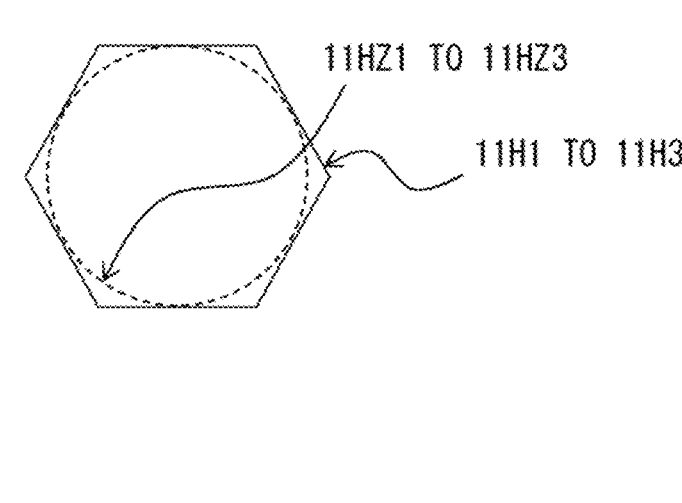

[FIG. 7A]
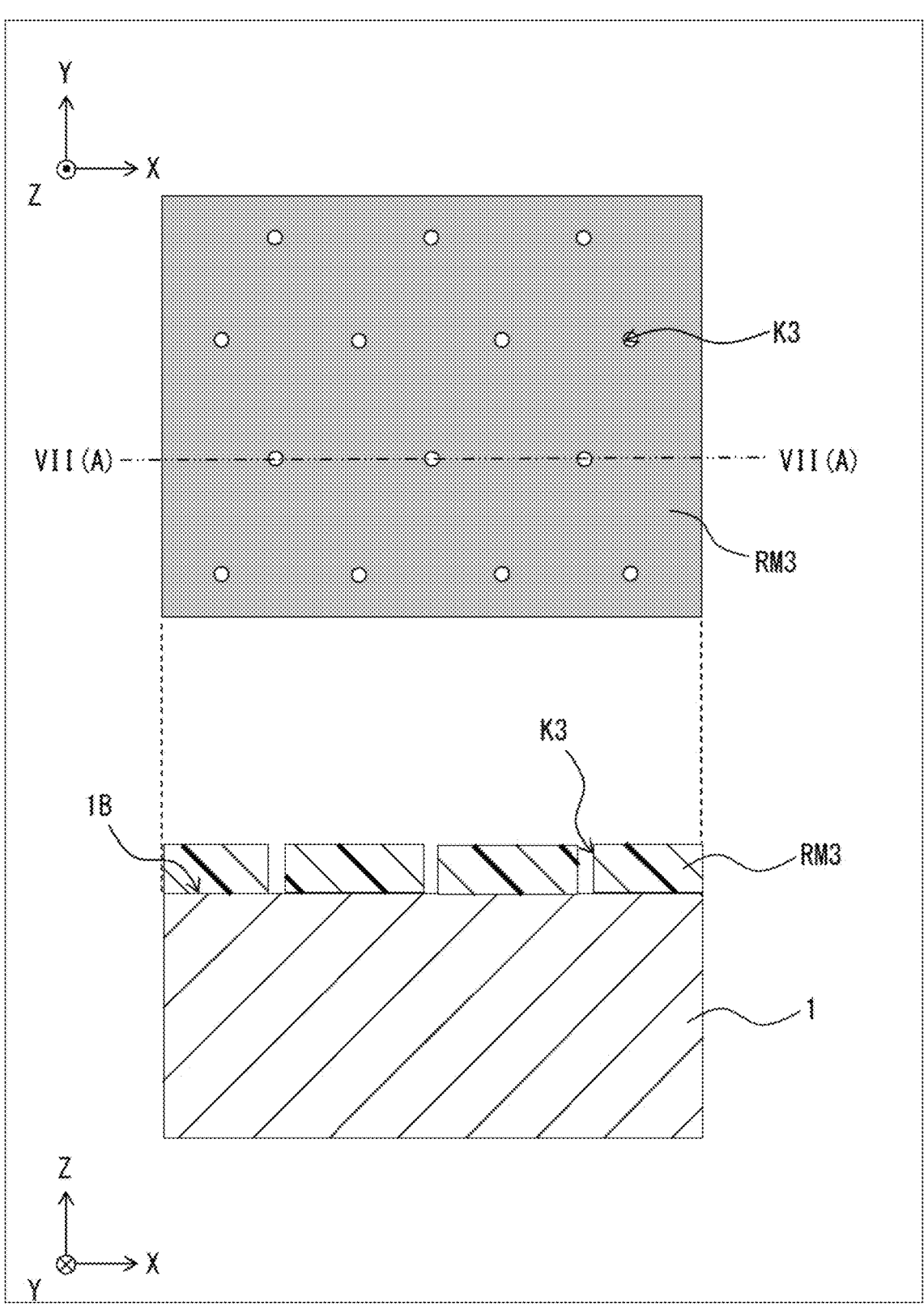

[FIG. 7B]
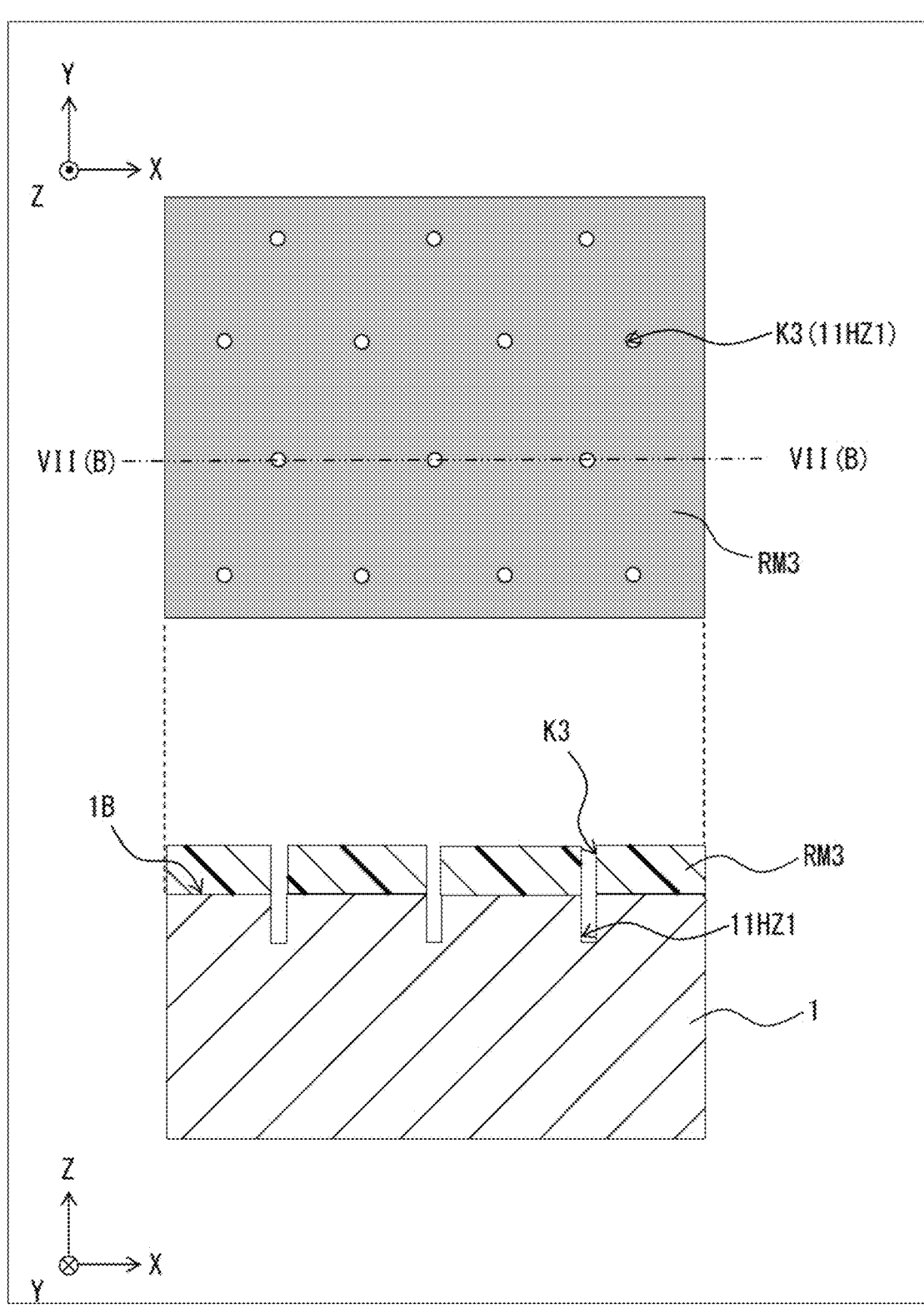

[FIG. 7C]
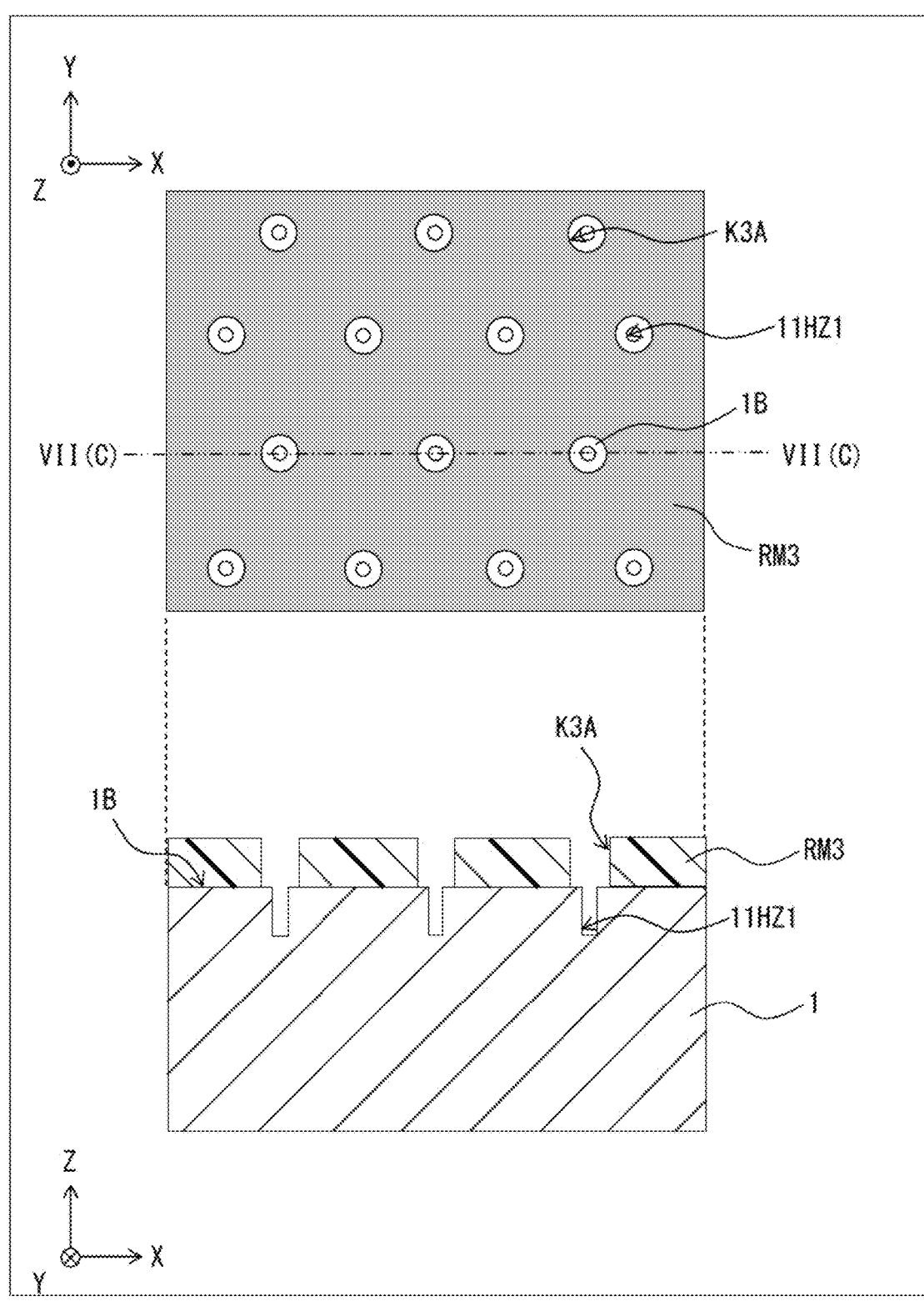

[FIG. 7D]
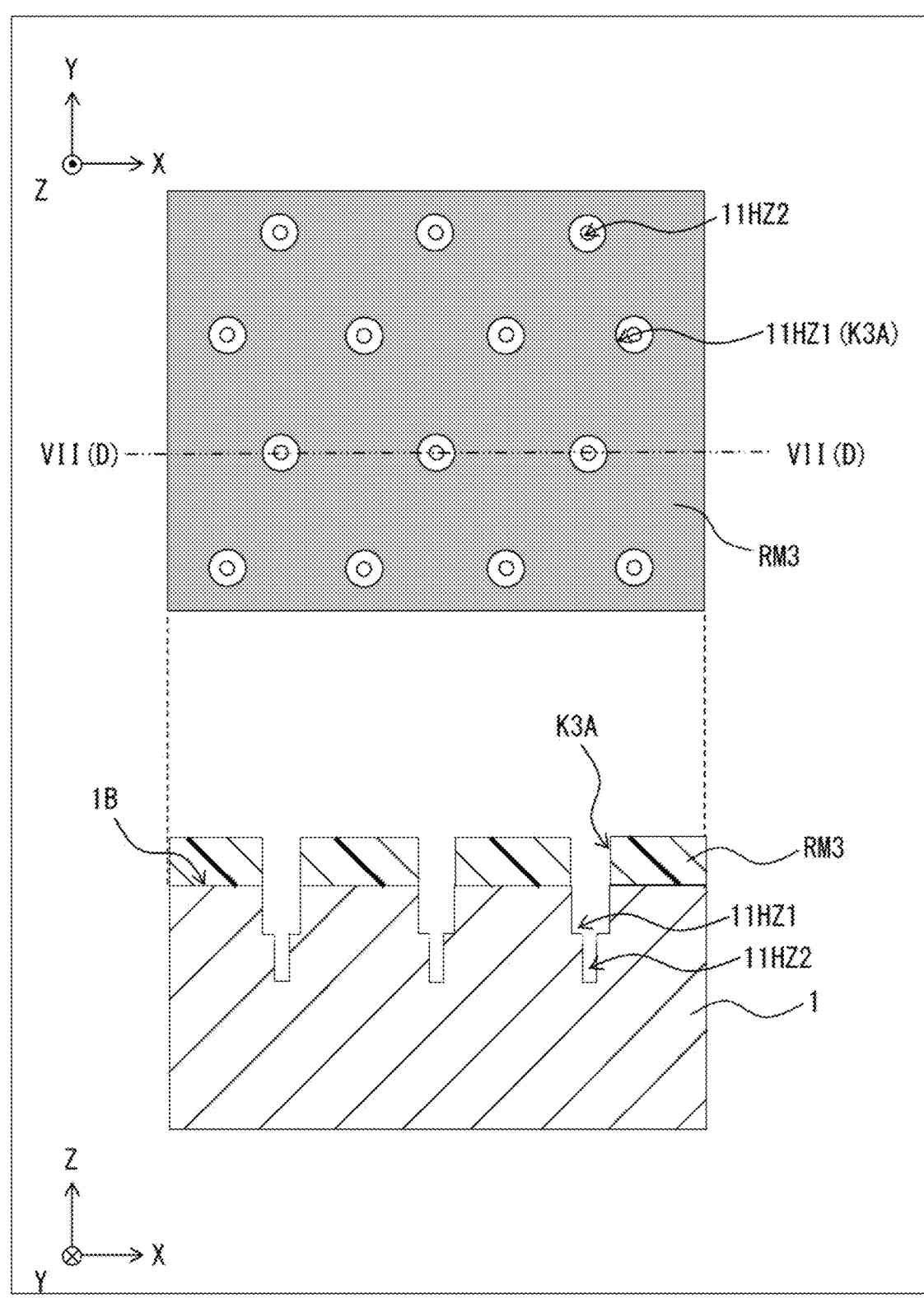

[FIG. 7E]
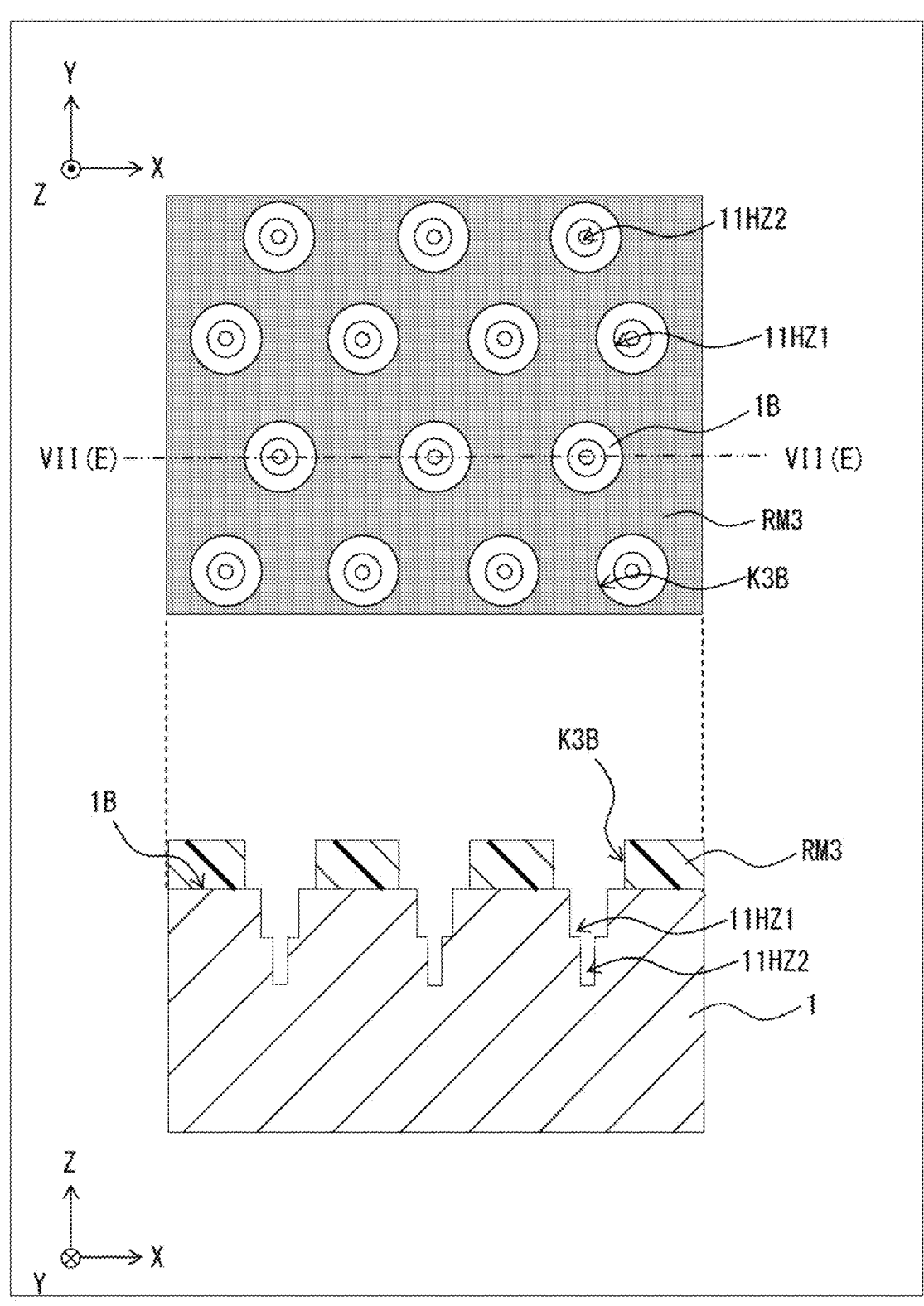

[FIG. 7F]
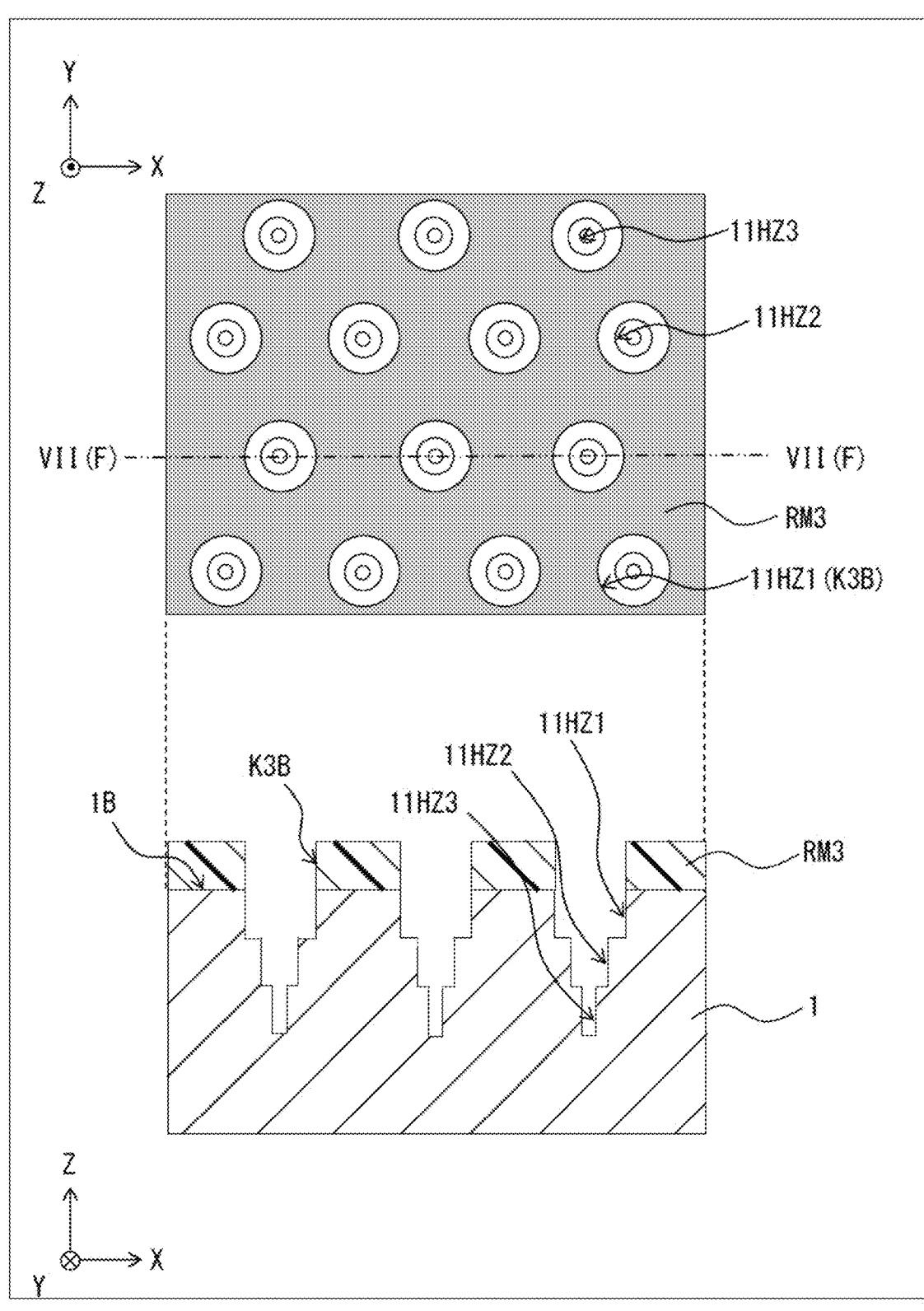

[FIG. 8]
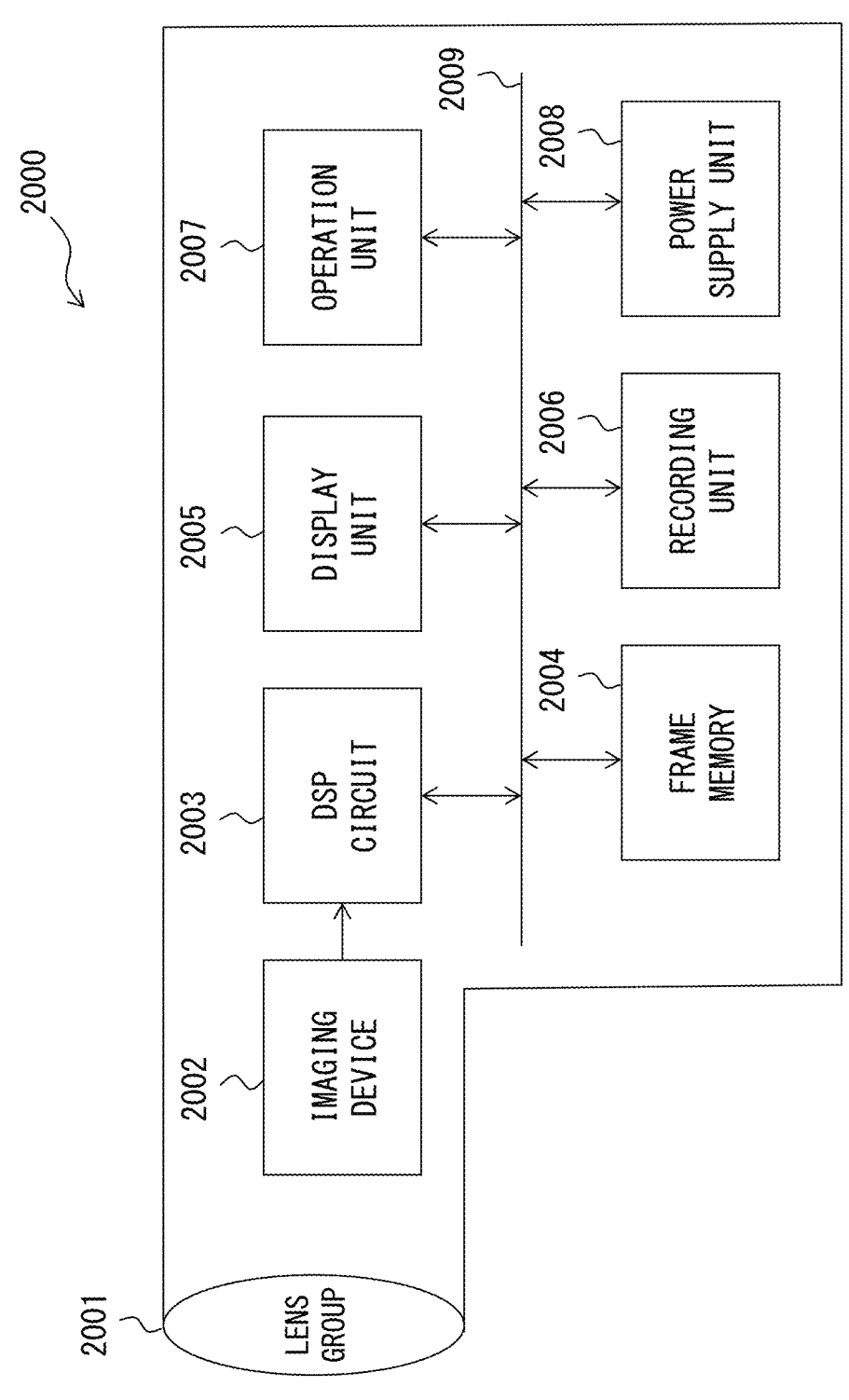

[FIG. 9]
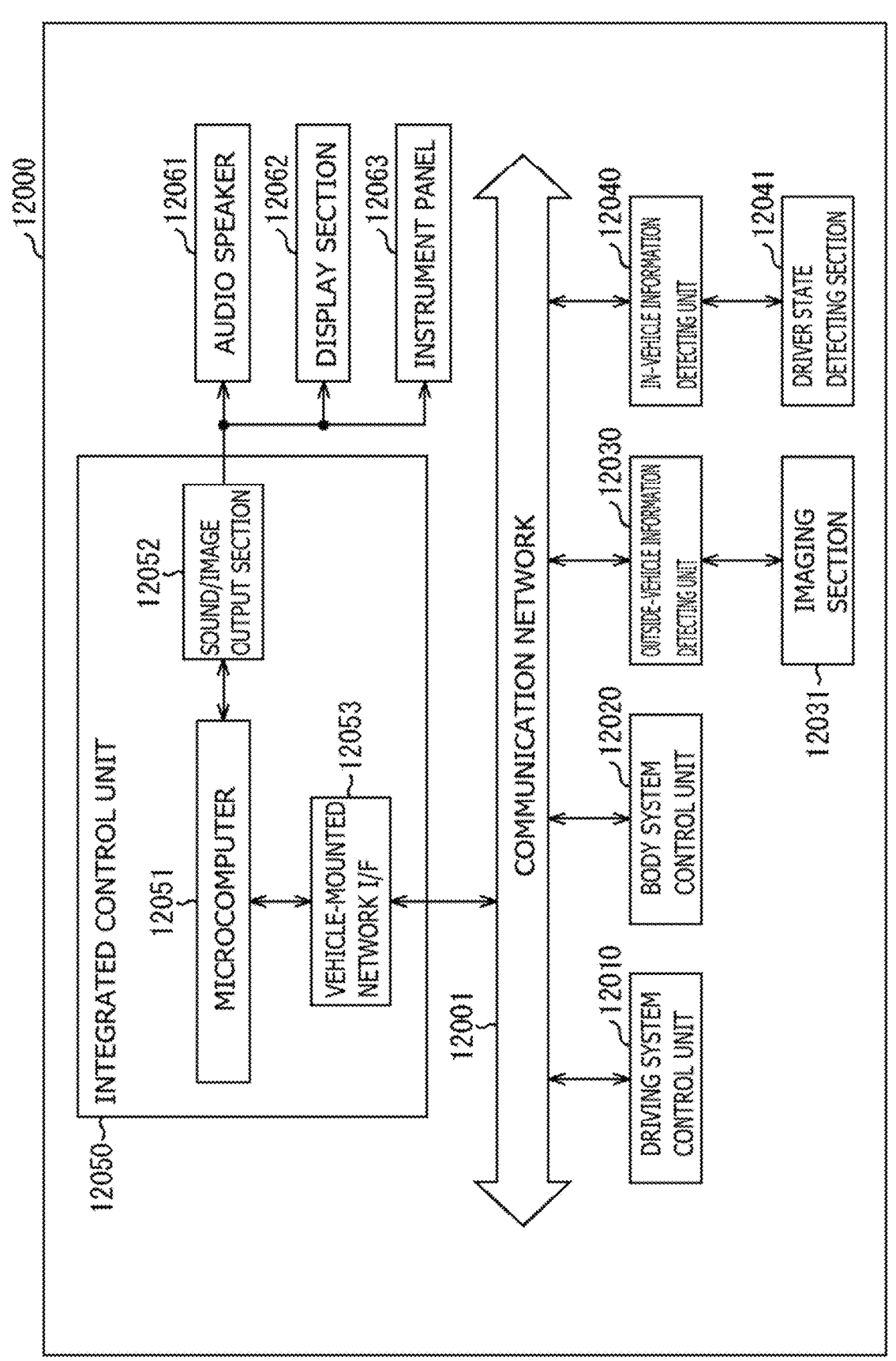

[FIG. 10]
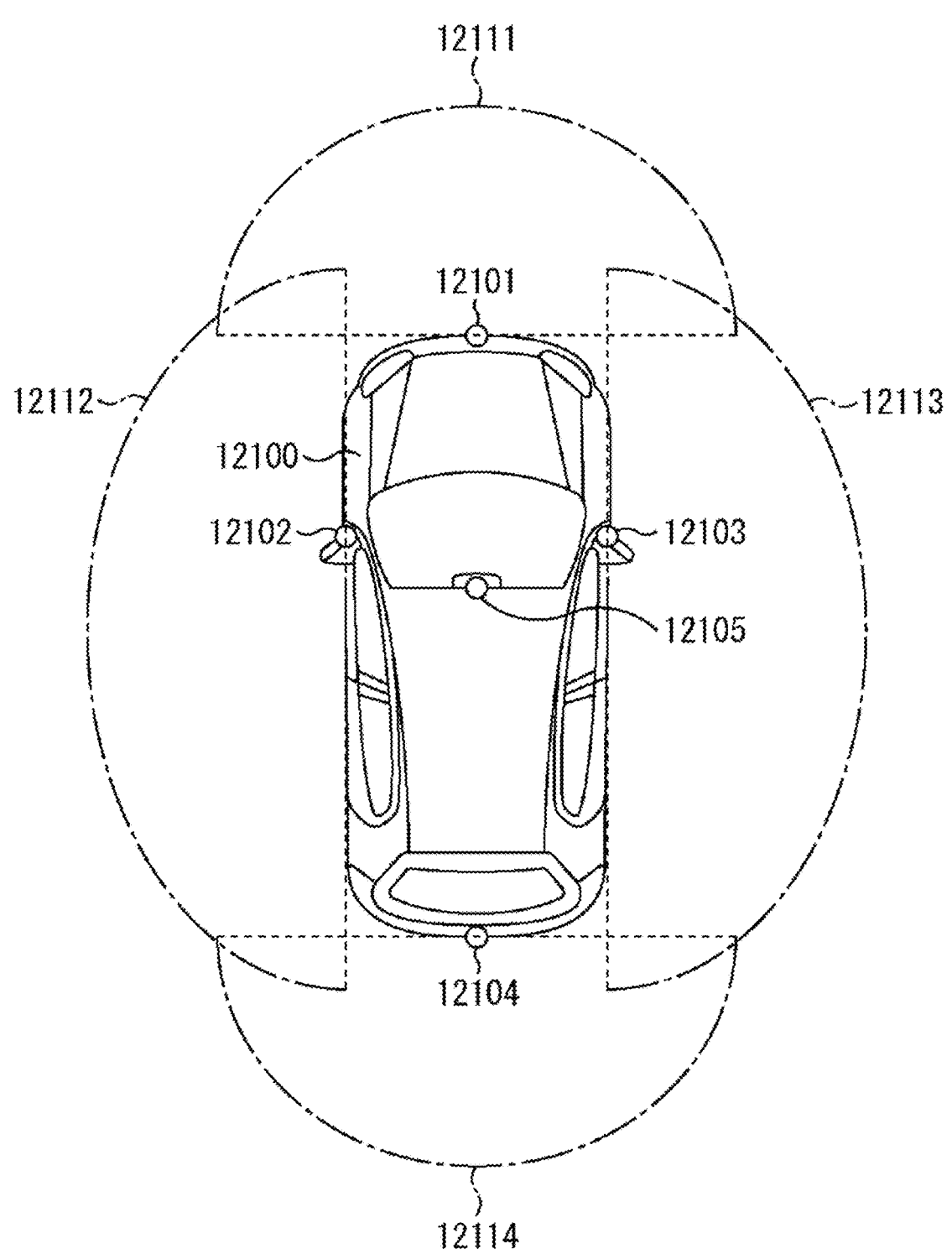

[FIG. 11A]
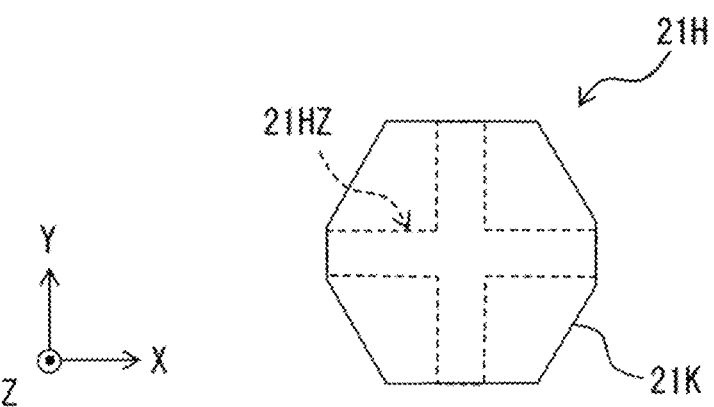
[FIG. 11B]
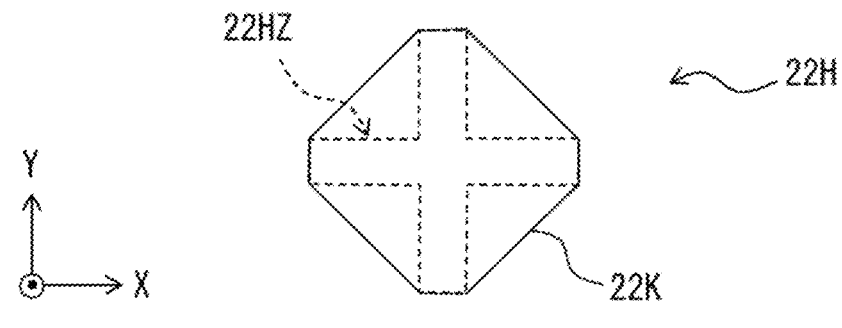
[FIG. 11C]
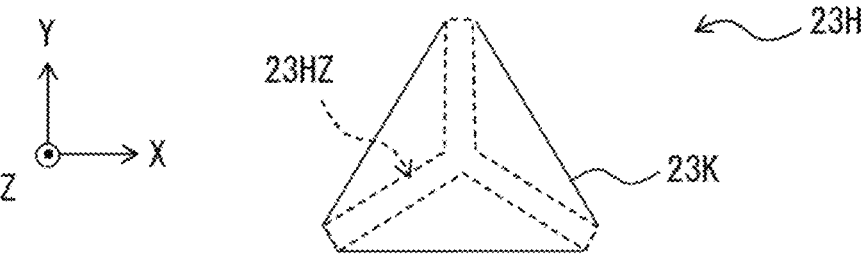
[FIG. 11D]
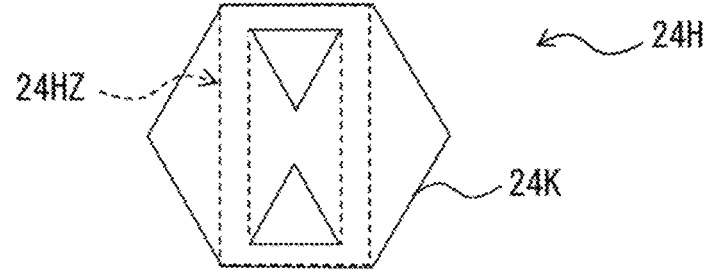

[FIG. 12A]
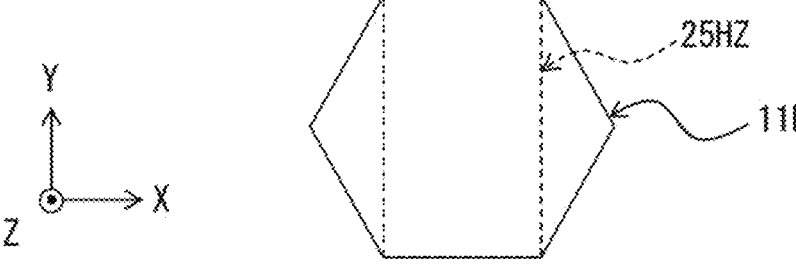
[FIG. 12B]
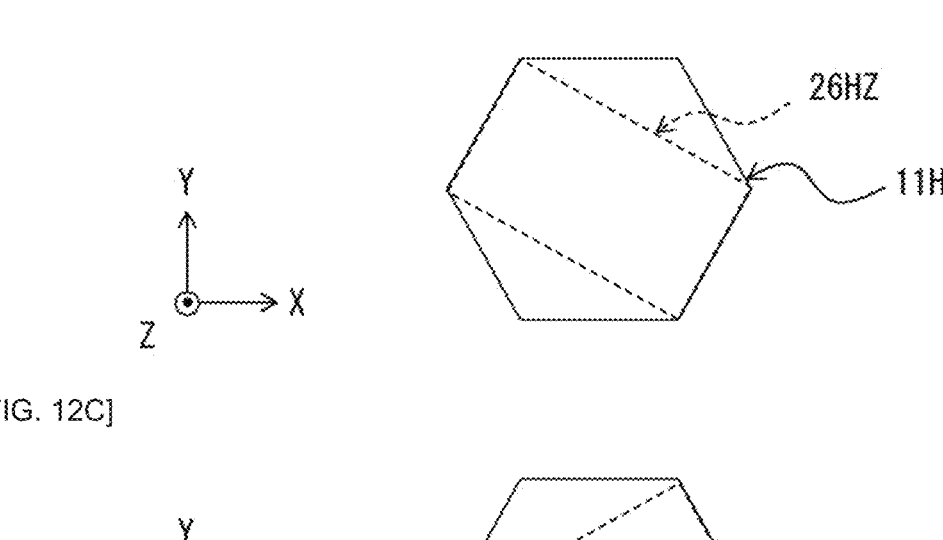
[FIG. 12C]
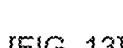
[FIG. 13]
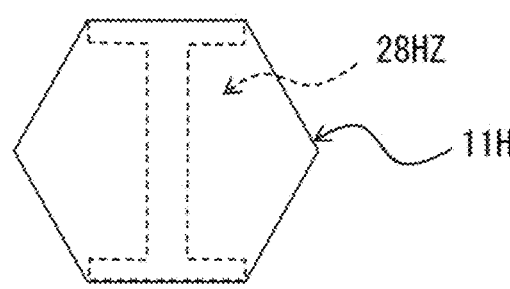

[FIG. 14A]
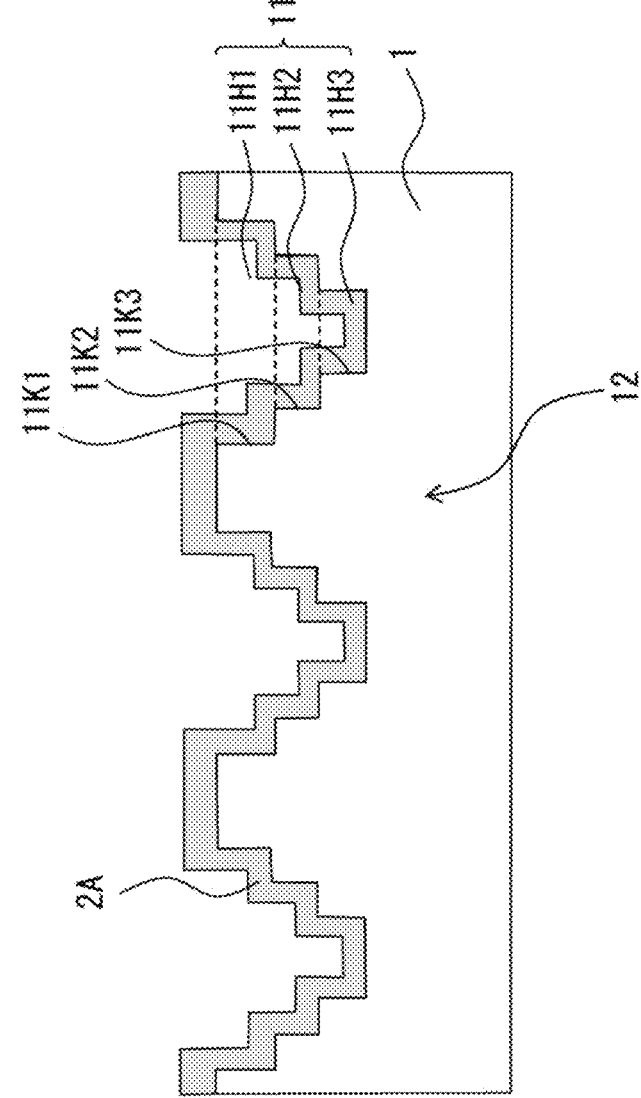
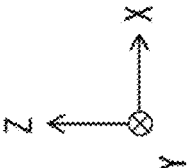

[FIG. 14B]
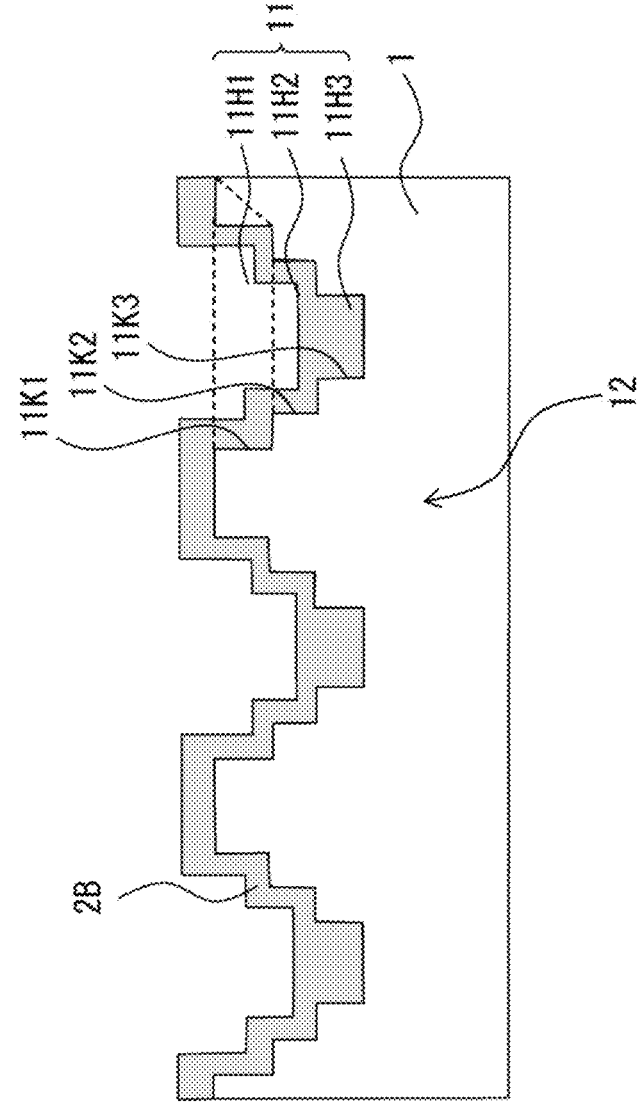
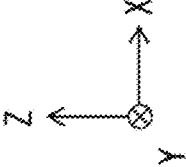

[FIG. 15]
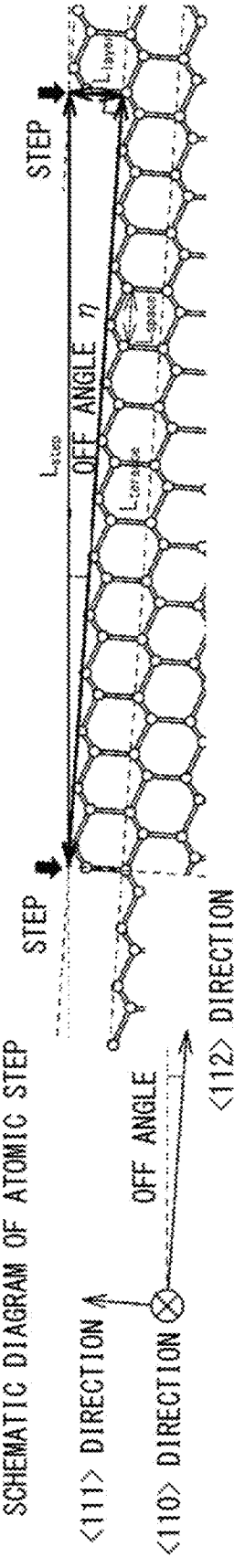

IMAGING DEVICE, METHOD OF MANUFACTURING IMAGING DEVICE, AND ELECTRONIC APPARATUS

CROSS REFERENCE TO RELATED APPLICATIONS

This application is a U.S. National Phase of International Patent Application No. PCT/JP2020/041674 filed on Nov. 9, 2020, which claims priority benefit of Japanese Patent Application No. JP 2019-208122 filed in the Japan Patent Office on Nov. 18, 2019. Each of the above-referenced applications is hereby incorporated herein by reference in its entirety.

TECHNICAL FIELD

The present disclosure relates to an imaging device that performs imaging by performing photoelectric conversion, a method of manufacturing the imaging device, and an electronic apparatus including the imaging device.

BACKGROUND ART

A solid-state imaging element has been proposed so far that effectively suppresses the reflection of incident light by providing the incidence surface with an uneven structure (see, for example, PTL 1).

CITATION LIST

Patent Literature

PTL 1: International Publication No. WO 2016/065024

SUMMARY OF THE INVENTION

Such an imaging device is requested to suppress the reflection of incident light still more effectively and have excellent sensitivity characteristics.

An imaging device according to an embodiment of the present disclosure includes a semiconductor substrate and a photoelectric conversion section. The semiconductor substrate includes a multi-stepped recess in which a plurality of respective holes defined by first outlines having substantially polygonal shapes is continuous in a thickness direction. The substantially polygonal shapes extend along a first surface orthogonal to the thickness direction and are different from each other in size in a plan view taken along the thickness direction. The photoelectric conversion section generates electric charge through photoelectric conversion. The photoelectric conversion section is defined by a second outline including a portion inclined with respect to the first outlines of the holes in a plan view. The electric charge corresponds to an amount of incident light passing through the multi-stepped recess.

In addition, an electronic apparatus according to an embodiment of the present disclosure includes the imaging device described above.

A method of manufacturing an imaging device according to an embodiment of the present disclosure includes the following operations (A) to (C).

(A) preparing a Si {111} substrate having a first crystal plane represented by a plane index {111}, the first crystal plane extending along a first surface orthogonal to a thickness direction;

(B) forming a photoelectric conversion section in the Si {111} substrate, the photoelectric conversion section generating electric charge through photoelectric conversion, the electric charge corresponding to an amount of received light; and (C) forming a hole by performing crystal anisotropic etching on the Si {111} substrate and forming the first crystal plane of the Si {111} substrate represented by the plane index {111} and a second crystal plane of the Si {111} substrate represented by the plane index {111}, the crystal anisotropic etching using an etching solution, the first crystal plane being orthogonal to the thickness direction, the second crystal plane being inclined with respect to the thickness direction, the hole including a first surface along the first crystal plane and a second surface along the second crystal plane and having an outline having a substantially polygonal shape in a plan view taken along the thickness direction.

BRIEF DESCRIPTION OF DRAWING

FIG. 1 is a block diagram illustrating a functional configuration example of an imaging device according to a first embodiment of the present disclosure.

FIG. 2 is a circuit diagram illustrating a circuit configuration of one sensor pixel in the imaging device illustrated in FIG. 1.

FIG. 3 is a schematic cross-section view of a configuration of a portion of sensor pixels in the imaging device illustrated in FIG. 1.

FIG. 4 is an enlarged cross-sectional view of a main portion of the sensor pixel illustrated in FIG. 3.

FIG. 5 is a schematic plan view of the configuration of the portion of the sensor pixels in the imaging device illustrated in FIG. 1.

FIG. 6A is a cross-sectional view of a step of a first method of manufacturing the imaging device illustrated in FIG. 1.

FIG. 6B is a cross-sectional view of a step subsequent to FIG. 6A.

FIG. 6C is a cross-sectional view of a step subsequent to FIG. 6B.

FIG. 6D is a cross-sectional view of a step subsequent to FIG. 6C.

FIG. 6E is a cross-sectional view of a step subsequent to FIG. 6D.

FIG. 6F is a cross-sectional view of a step subsequent to FIG. 6E.

FIG. 6G is a cross-sectional view of a step subsequent to FIG. 6F.

FIG. 6H is a cross-sectional view of a step subsequent to FIG. 6G.

FIG. 6I is a cross-sectional view of a step subsequent to FIG. 6H.

FIG. 6J is a plan view describing a changing planar shape of a hole in a wet etching step subsequent to FIG. 6I.

FIG. 7A is a cross-sectional view of a step of the first method of manufacturing the imaging device illustrated in FIG. 1.

FIG. 7B is a cross-sectional view of a step subsequent to FIG. 7A.

FIG. 7C is a cross-sectional view of a step subsequent to FIG. 7B.

FIG. 7D is a cross-sectional view of a step subsequent to FIG. 7C.

FIG. 7E is a cross-sectional view of a step subsequent to FIG. 7D.

FIG. 7F is a cross-sectional view of a step subsequent to FIG. 7E.

FIG. 8 is a schematic diagram illustrating an overall configuration example of an electronic apparatus.

FIG. 9 is a block diagram depicting an example of schematic configuration of a vehicle control system.

FIG. 10 is a diagram of assistance in explaining an example of installation positions of an outside-vehicle information detecting section and an imaging section.

FIG. 11A is a plan view of a first modification example of a planar shape of a multi-stepped recess illustrated in FIG. 5.

FIG. 11B is a plan view of a second modification example of the planar shape of the multi-stepped recess illustrated in FIG. 5.

FIG. 11C is a plan view of a third modification example of the planar shape of the multi-stepped recess illustrated in FIG. 5.

FIG. 11D is a plan view of a fourth modification example of the planar shape of the multi-stepped recess illustrated in FIG. 5.

FIG. 12A is an explanatory diagram illustrating a first modification example of a method of processing the multi-stepped recess illustrated in FIG. 5.

FIG. 12B is a plan view of a second modification example of the method of processing the multi-stepped recess illustrated in FIG. 5.

FIG. 12C is a plan view of a third modification example of the method of processing the multi-stepped recess illustrated in FIG. 5.

FIG. 13 is a plan view of a fourth modification example of the method of processing the multi-stepped recess illustrated in FIG. 5.

FIG. 14A is a cross-sectional view of a first modification example of a cross-sectional shape of the sensor pixel according to the present disclosure.

FIG. 14B is a cross-sectional view of a second modification example of the cross-sectional shape of the sensor pixel according to the present disclosure.

FIG. 15 is a schematic diagram describing an off angle on a front surface of a Si substrate according to the present disclosure.

MODES FOR CARRYING OUT THE INVENTION

The following describes embodiments of the present disclosure in detail with reference to the drawings. It is to be noted that description is given in the following order.

1. Embodiment
2. Example of Application to Electronic Apparatus
3. Example of Application to Mobile Body
4. Other Modification Examples

1. Embodiment

[Configuration of Solid-State Imaging Device 101]

FIG. 1 is a block diagram illustrating a configuration example of a solid-state imaging device 101 according to an embodiment of the present technology.

The solid-state imaging device 101 is, for example, a back-illuminated image sensor of a so-called global shutter mode such as a CMOS (Complementary Metal Oxide Semiconductor) image sensor. The solid-state imaging device 101 receives light from a subject and performs photoelectric conversion. The solid-state imaging device 101 generates an image signal to capture an image.

The global shutter mode is a mode for performing global exposure in which exposure is basically begun at the same time for all the pixels and is finished at the same time for all the pixels. Here, all the pixels refer to all the pixels in the portion appearing in an image and exclude dummy pixels or the like. In addition, in a case where a time difference or image distortion is small enough to raise no issue, the global shutter mode also includes a mode of changing regions for global exposure while performing global exposure not at the same time for all the pixels, but for a plurality of rows (e.g., several tens of rows). In addition, the global shutter mode also includes a mode of performing global exposure for the pixels in a predetermined region rather than all the pixels in the portion appearing in an image.

The back-illuminated image sensor refers to an image sensor having a configuration in which a photoelectric conversion section such as a photodiode is provided between a light receiving surface and a wiring layer. The photoelectric conversion section receives light from a subject and converts the light into an electric signal. Light from a subject enters the light receiving surface. The wiring layer is provided with a wiring line of a transistor or the like that drives each of pixels. It is to be noted that the present technology is not limited to the application to a CMOS image sensor.

The solid-state imaging device 101 includes, for example, a pixel array unit 111, a vertical drive unit 112, a ramp wave module 113, a column signal processing unit 114, a clock module 115, a data storage unit 116, a horizontal drive unit 117, a system control unit 118, and a signal processing unit 119.

In the solid-state imaging device 101, the pixel array unit 111 is formed on a semiconductor substrate 1 (that is described below). Peripheral circuits such as the vertical drive unit 112 to the signal processing unit 119 are provided, for example, on the semiconductor substrate 1 as with the pixel array unit 111.

The pixel array unit 111 includes a plurality of sensor pixels PX each including a plurality of sensor pixels 121 each including a photoelectric conversion element that generates electric charge corresponding to the amount of light coming from a subject and accumulates the electric charge. As illustrated in FIG. 1, the sensor pixels 121 are arranged in both the horizontal direction (row direction) and the vertical direction (column direction). In the pixel array unit 111, there is provided a pixel drive line 122 in the row direction for each of the pixel rows and there is provided a vertical signal line 123 in the column direction for each of the pixel columns. Each of the pixel rows includes the sensor pixels 121 arranged in line in the row direction. Each of the pixel columns includes the sensor pixels 121 arranged in line in the column direction.

The vertical drive unit 112 includes a shift register, an address decoder, and the like. The vertical drive unit 112 drives all of the plurality of sensor pixels 121 in the pixel array unit 111 at the same time or drives the plurality of sensor pixels 121 in the pixel array unit 111 for each of the pixel rows by supplying the plurality of sensor pixels 121 with signals or the like through the plurality of pixel drive lines 122.

The ramp wave module 113 generates a ramp wave signal to be used for the A/D (Analog/Digital) conversion of a pixel signal and supplies the ramp wave signal to the column signal processing unit 114. The column signal processing unit 114 includes, for example, a shift register, an address decoder, and the like and performs a noise removal process, a correlation double sampling process, an A/D conversion process, and the like to generate a pixel signal. The column signal processing unit 114 supplies the generated pixel signal to the signal processing unit 119.

The clock module 115 supplies each of the units of the solid-state imaging device 101 with a clock signal for an operation.

The horizontal drive unit 117 selects, in order, unit circuits corresponding to pixel columns of the column signal processing unit 114. The selective scanning by this horizontal drive unit 117 causes the pixel signals that have been subjected to signal processing for each of the unit circuits in the column signal processing unit 114 to be outputted to the signal processing unit 119 in order.

The system control unit 118 includes a timing generator or the like that generates a variety of timing signals. The system control unit 118 performs drive control on the vertical drive unit 112, the ramp wave module 113, the column signal processing unit 114, the clock module 115, and the horizontal drive unit 117 on the basis of the timing signals generated by the timing generator.

While temporarily storing data in the data storage unit 116 as necessary, the signal processing unit 119 performs signal processing such as an arithmetic process on the pixel signals supplied from the column signal processing unit 114 and outputs an image signal including each of the pixel signals.

[Configuration of Sensor Pixel 121]

Next, with reference to FIG. 2, a circuit configuration example of the sensor pixel 121 formed in the pixel array unit 111 in FIG. 1 is described. FIG. 2 illustrates a circuit configuration example of the one sensor pixel 121 in the pixel array unit 111.

In the example of FIG. 2, the sensor pixel 121 in the pixel array unit 111 includes a photoelectric conversion section 51, a first transfer transistor (TRX) 52, a second transfer transistor (TRM) 53, an electric charge holding section (MEM) 54, a third transfer transistor (TRG) 55, an electric charge voltage conversion section (FD) 56, a discharge transistor (OFG) 57, a reset transistor (RST) 58, an amplification transistor (AMP) 59, and a selection transistor (SEL) 60.

In addition, in this example, all of the TRX 52, the TRM 53, the TRG 55, the OFG 57, the RST 58, the AMP 59, and the SEL 60 are N-type MOS transistors. The respective gate electrodes of the TRX 52, the TRM 53, the TRG 55, the OFG 57, the RST 58, and the SEL 60 are each supplied with a predetermined drive signal. The drive signal is a pulse signal whose high level state corresponds to an active state (on state) and whose low level state corresponds to an inactive state (off state). It is to be noted that the following also refers to bringing a drive signal into the active state as turning on the drive signal and refers to bringing a drive signal into the inactive state as turning off the drive signal.

The photoelectric conversion section 51 is, for example, a photoelectric conversion element including a PN-junction photodiode. The photoelectric conversion section 51 receives light from a subject, generates electric charge corresponding to the amount of received light through photoelectric conversion, and accumulates the electric charge. In the pixel array unit 111, the plurality of photoelectric conversion sections 51 is disposed along the XY plane.

The TRX 52 is coupled between the photoelectric conversion section 51 and the TRM 53. The TRX 52 transfers the electric charge accumulated in the photoelectric conversion section 51 to the MEM 54 in accordance with a drive signal applied to the gate electrode of the TRX 52.

The TRM 53 controls the potential of the MEM 54 in accordance with a drive signal applied to the gate electrode of the TRM 53. For example, in a case where a drive signal turns on the TRM 53, the potential of the MEM 54 is deepened. In addition, in a case where a drive signal turns off the TRM 53, the potential of the MEM 54 is made shallower. In a case where the TRX 52 and the TRM 53 are turned on, the electric charge accumulated in the photoelectric conversion section 51 is transferred to the MEM 54 through the TRX 52 and the TRM 53.

The MEM 54 is a region that temporarily holds the electric charge accumulated in the photoelectric conversion section 51 to achieve the global shutter function.

The TRG 55 is coupled between the TRM 53 and the FD 56. The TRG 55 transfers the electric charge held in the MEM 54 to the FD 56 in accordance with a drive signal S55 applied to the gate electrode of the TRG 55. For example, in a case where the TRM 53 is turned off and the TRG 55 is turned on, the electric charge held in the MEM 54 is transferred to the FD 56 through the TRM 53 and the TRG 55.

The FD 56 is a floating diffusion region that converts, into an electric signal (e.g., voltage signal), the electric charge transferred from the MEM 54 through the TRG 55 and outputs the converted electric signal. The RST 58 is coupled to the FD 56 and a vertical signal line VSL is coupled through the AMP 59 and the SEL 60.

The OFG 57 includes a drain coupled to a power supply VDD and a source coupled to a wiring line between the TRX 52 and the TRM 53. The OFG 57 initializes or resets the photoelectric conversion section 51 in accordance with a drive signal S57 applied to the gate electrode thereof. For example, in a case where the TRX 52 and the OFG 57 are each turned on by the drive signal, the potential of the photoelectric conversion section 51 is reset to the voltage level of the power supply VDD. In other words, the photoelectric conversion section 51 is initialized.

In addition, the OFG 57 forms an overflow path between the TRX 52 and the power supply VDD and discharges the electric charge overflowing from the photoelectric conversion section 51 to the power supply VDD.

The RST 58 includes a drain coupled to the power supply VDD and a source coupled to the FD 56. The RST 58 initializes or resets the respective regions of the MEM 54 to the FD 56 in accordance with a drive signal applied to the gate electrode thereof. For example, in a case where the TRG 55 and the RST 58 are each turned on in accordance with the drive signal, the potentials of the MEM 54 and the FD 56 are each reset to the voltage level of the power supply VDD. In other words, the MEM 54 and the FD 56 are each initialized.

The AMP 59 includes a gate electrode coupled to the FD 56 and a drain coupled to the power supply VDD. The AMP 59 serves as an input section of a source follower circuit that reads out electric charge obtained through photoelectric conversion by the photoelectric conversion section 51. In other words, the AMP 59 has the source coupled to the vertical signal line VSL through the SEL 60 to provide a source follower circuit together with a constant current source coupled to an end of the vertical signal line VSL.

The SEL 60 is coupled between the source of the AMP 59 and the vertical signal line VSL and the gate electrode of the SEL 60 is supplied with a drive signal S60 as a selection signal. In a case where the drive signal S60 is turned on, the SEL 60 enters a conduction state and the sensor pixel 121 provided with the SEL 60 enters a selected state. In a case where the sensor pixel 121 enters the selected state, a pixel signal outputted from the AMP 59 is read out by the column signal processing unit 114 through the vertical signal line VSL.

In addition, in the pixel array unit 111, the plurality of pixel drive lines 122 is provided, for example, for the respective pixel rows. The respective drive signals are then supplied from the vertical drive unit 112 to the selected sensor pixels 121 through the plurality of pixel drive lines 122.

It is to be noted that the pixel circuit illustrated in FIG. 2 is an example of a pixel circuit usable for the pixel array unit 111 and it is also possible to use a pixel circuit having another configuration. In addition, the following refers to the respective transistors of the RST 58, the AMP 59, and the SEL 60 as pixel transistors.

FIG. 3 is a schematic cross-sectional view of configurations of any three adjacent sensor pixels 121A to 121C in the pixel array unit 111 of the solid-state imaging device 101. FIG. 3, however, omits the description of components disposed at positions closer to a front surface 1A than the photoelectric conversion sections 51 of the respective sensor pixels 121A to 121C. Specifically, FIG. 3 omits the description of the TRX 52, the TRM 53, the TRG 55, the OFG 57, the RST 58, the AMP 59, the SEL 60, and the like.

As illustrated in FIG. 3, each of the sensor pixels 121 includes the semiconductor substrate 1, the photoelectric conversion section 51 buried in the semiconductor substrate 1, an optical material film 2, an insulating film 3, a light shielding film 4, a planarization film 5, a color filter 6, and an on-chip lens 7. In the solid-state imaging device 101, a back surface 1B of the semiconductor substrate 1 serves as the light receiving surface thereof. It is to be noted that this specification defines a plane in which the semiconductor substrate 1 extends as an XY plane and defines the thickness direction of the semiconductor substrate 1 as a Z axis direction.

The semiconductor substrate 1 includes, for example, a Si {111} substrate. The Si {111} substrate is a single-crystal silicon substrate having the crystal orientation of {111}. The semiconductor substrate 1 has the back surface 1B and the front surface 1A opposite to the back surface 1B. The back surface 1B is a light receiving surface that receives light from a subject. The light passes through the on-chip lens 7, the color filter 6, the insulating film 3, and the optical material film 2 in order. There is provided an uneven structure 12 near the back surface 1B. The uneven structure 12 includes a plurality of multi-stepped recesses 11 extending down from the rear surface 1B to the front surface 1A. The semiconductor substrate 1 is provided with the plurality of multi-stepped recesses 11 for the one sensor pixel 121. In other words, the plurality of multi-stepped recesses 11 is provided for the one photoelectric conversion section 51. It is to be noted that the uneven structure 12 is described in detail below.

Further, the semiconductor substrate 1 has the trench 13 in the boundary portion between the adjacent sensor pixels 121, namely the inter-pixel region. The trench 13 extends halfway to the front surface 1A from the back surface 1B along the thickness direction (Z axis direction) of the semiconductor substrate 1.

The photoelectric conversion section 51 generates, through photoelectric conversion, the electric charge corresponding to the amount of incident light passing through the multi-stepped recess 11. The photoelectric conversion section 51 is defined by an outline 51K including a portion inclined with respect to an outline 11K (described below) of a hole 11H (described below) in a plan view (see FIG. 5 described below). In other words, the photoelectric conversion section 51 has a substantially polygonal shape (e.g., rectangular shape) different from substantially polygonal shapes (e.g., substantially hexagonal shapes) made by the outlines 11K of the plurality of holes 11H included in the multi-stepped recess 11 in a plan view. The photoelectric conversion section 51 includes, for example, an N--type semiconductor region and an N-type semiconductor region in order from positions closer to the back surface 1B. Light entering the back surface 1B is photoelectrically converted to generate electric charge, for example, in the N--type semiconductor region and the electric charge is then accumulated in the N-type semiconductor region. It is to be noted that the boundary between the N--type semiconductor region and the N-type semiconductor region is not necessarily clear. It is sufficient if the concentration of N-type impurities is gradually increased, for example, from the N--type semiconductor region toward the N-type semiconductor region.

The optical material film 2 is provided, for example, to cover the whole of the back surface 1B of the semiconductor substrate 1. The optical material film 2 is an anti-reflection film that is provided, for example, along the inner surface of the multi-stepped recess 11 to cover the inner surface thereof or provided to fill the multi-stepped recess 11. The optical material film 2 is further provided to cover the inner surface of the trench 13 provided in an inter-pixel region. The optical material film 2 has a lower refractive index than the refractive index of the semiconductor substrate 1. For example, in a case where the semiconductor substrate 1 is Si having a refractive index n1 of about 4.1, favorable examples of a material included in the optical material film 2 include SiN (silicon nitride), $HfO_2$, $Ta_2O_5$, $Nb_2O_5$, $TiO_2$, and the like each having a refractive index n2 of 1.9 to 2.3.

The insulating film 3 is provided to cover the optical material film 2. The insulating film 3 further includes a separation wall 3T extending in the thickness direction (Z axis direction) of the semiconductor substrate 1 inside the trench 13. The insulating film 3 includes, for example, an insulating material such as oxide. The insulating film 3 electrically insulates the adjacent sensor pixels 121 from each other. The insulating film 3 prevents the crosstalk of pixel signals between the adjacent sensor pixels 121. In addition, it is favorable that the insulating film 3 include a material having a lower refractive index n3 than the refractive index n2 of the optical material film 2. Favorable examples of a material included in the insulating film 3 thus include silicon oxide ($SiO_2$) having the refractive index n3 that is equal to 1.46. It is to be noted that the separation wall 3T is provided as a portion of the insulating film 3 in FIG. 3, but the separation wall 3T may also be provided as a different entity from the insulating film 3 and provided in each of the inter-pixel regions in the semiconductor substrate 1.

The light shielding film 4 is provided on the insulating film 3 in an inter-pixel region. The light shielding film 4 is a film including, for example, a metal material such as W (tungsten). The light shielding film 4 blocks incident light entering the adjacent pixels and prevents the crosstalk between the adjacent pixels.

The planarization film 5 is formed to cover the whole of the insulating film 3 and planarize the upper surface thereof. The planarization film 5 includes, for example, a transparent resin or the like. The planarization film 5 seals and couples the color filter 6 and the on-chip lens 7 and the insulating film 3.

The color filter 6 is an optical member that selectively transmits only the light in a specific wavelength range among the pieces of incident light passing through the on-chip lens 7. A color filter 6A transmits only the light in the wavelength range corresponding, for example, to red, a color filter 6B transmits only the light in the wavelength range corresponding, for example, to green, and a color filter 6C transmits, only the light in the wavelength range corresponding, for example, to blue.

The on-chip lens 7 is provided to cover the insulating film 3 and the color filter 6 and includes a plurality of convex sections 7T that is provided for each of the sensor pixels 121. Each of the convex sections 7T of the on-chip lens 7 condenses incident light on each of the photoelectric conversion sections 51.

[Configuration of Uneven Structure 12]

Next, the uneven structure 12 is described in detail with reference to FIGS. 4 and 5. FIG. 4 is an enlarged cross-sectional view of a portion of the sensor pixel 121A. Specifically, FIG. 4 is an enlarged cross-sectional view of the surrounded portion IV illustrated in FIG. 3. In addition, FIG. 5 is an enlarged plan view of the uneven structure 12 in a portion of the pixel array unit 111 of the solid-state imaging device 101. It is to be noted that FIG. 4 illustrates an arrow-direction cross section taken along the IV-IV line illustrated in FIG. 5.

As illustrated in FIG. 4, the uneven structure 12 includes the plurality of multi-stepped recesses 11 each including a stepped inner surface. As illustrated in FIGS. 4 and 5, the plurality of holes 11H (11H1 to 11H3) is continuous in the thickness direction (Z axis direction) in the multi-stepped recess 11. The plurality of holes 11H (11H1 to 11H3) respectively includes the outlines 11K (11K1 to 11K3) having substantially polygonal shapes different from each other in size in a plan view taken along the thickness direction (Z axis direction).

As illustrated in FIG. 5, in the pixel array unit 111, the plurality of multi-stepped recesses 11 is discretely provided to extend along the back surface 1B. The respective holes 11H1 to 11H3 included in each of the multi-step recesses 11 include the outlines 11K1 to 11K3 having substantially polygonal shapes similar to each other. FIG. 5 illustrates an example in which the outlines 11K1 to 11K3 have substantially hexagonal shapes. In other words, each of the holes 11H1 to 11H3 forms a space shaped like a hexagonal column. In addition, the central positions of the respective holes 11H1 to 11H3 included in the one multi-stepped recess 11 substantially coincide with each other. Further, as illustrated in FIGS. 4 and 5, the area of the bottom surface of the hole 11H2 continuous to the hole 11H1 is smaller than the area of the bottom surface of the hole 11H1. The area of the bottom surface of the hole 11H3 continuous to the hole 11H2 is smaller than the area of the bottom surface of the hole 11H2. The multi-stepped recess 11 thus forms a pyramid-shaped space as a whole to reduce the area of the bottom surface of the hole 11H as the depth from the back surface 1B serving as a reference increases. In the examples of FIGS. 3 and 4, the pyramid-shaped space formed by the multi-stepped recess 11 is filled with the optical material film 2.

It is favorable that the depth of each of the holes 11H1 to 11H3 included in the multi-stepped recess 11 be, for example, several tens of nm to several hundreds of nm. For example, in a case of a depth of 40 nm to 50 nm, which is approximately a tenth of incident light of 400 nm, the multi-stepped recess 11 has a pseudo-pyramidal shape and it is considered possible to reduce the reflectance near the back surface 1B.

It is to be noted that it is favorable that the plurality of multi-stepped recesses 11 have substantially the same dimensions in the pixel array unit 111, but a portion of the multi-stepped recesses 11 may have different dimensions. In addition, it is favorable that the plurality of multi-stepped recesses 11 be disposed adjacent to each other along the back surface 1B extending in the XY plane in the pixel array unit 111. The wording "disposed adjacent" here means, for example, that a maximum width W11 of any of the multi-stepped recesses 11 parallel with the XY plane is longer than an interval D11 to the other multi-stepped recess 11 adjacent to the multi-stepped recess 11 (see FIG. 5).

[Method of Manufacturing Solid-State Imaging Device 101]
(First Manufacturing Method)

Next, a first manufacturing method is described as an example of the method of manufacturing the solid-state imaging device 101 with reference to FIGS. 6A, 6B, 6C, 6D, 6E, 6F, 6G, 6H and 6I. It is to be noted that a step of forming the multi-stepped recess 11 is chiefly described here.

FIG. 6A includes a plan view (the upper part of the diagram) and a cross-sectional view (the lower part of the diagram) for describing a first step in the first method of manufacturing the solid-state imaging device 101. The cross-sectional view of FIG. 6A illustrates a cross section taken along the VI(A)-VI(A) line illustrated in the plan view of FIG. 6A. First, as illustrated in FIG. 6A, after the semiconductor substrate 1 is prepared in which the photoelectric conversion section 51 and the like are each formed at a predetermined position, a resist mask RM1 is formed that selectively covers the back surface 1B. The resist mask RM1 includes a photoresist material including, for example, a polymer as a principal component. The resist mask RM1 has an opening K1 at a position on the back surface 1B at which the multi-stepped recess 11 is to be formed. It is assumed that the opening K1 has, for example, a substantially circular shape in a plan view.

Next, as illustrated in FIG. 6B, a portion of the Si {111} included in the semiconductor substrate 1 exposed in the opening K1 is dug by dry etching that uses the resist mask RM1. This forms a hole 11HZ1 that finally serves as the hole 11H1. It is to be noted that FIG. 6B includes a plan view (the upper part of the diagram) and a cross-sectional view (the lower part of the diagram) for describing a second step in the first method of manufacturing the solid-state imaging device 101. The cross-sectional view of FIG. 6B illustrates a cross section taken along the VI(B)-VI(B) line illustrated in the plan view of FIG. 6B.

After the hole 11H1 is formed, the resist mask RM1 is removed as illustrated in FIG. 6C. This exposes the back surface 1B. It is to be noted that FIG. 6C includes a plan view (the upper part of the diagram) and a cross-sectional view (the lower part of the diagram) for describing a third step in the first method of manufacturing the solid-state imaging device 101. The cross-sectional view of FIG. 6C illustrates a cross section taken along the VI(C)-VI(C) line illustrated in the plan view of FIG. 6C.

After the resist mask RM1 is removed, an oxide film OF is formed to cover the whole of the back surface 1B and the hole 11HZ1 as illustrated in FIG. 6D. For example, $SiO_2$ (silicon oxide) or the like is favorable as the oxide film here. It is to be noted that FIG. 6D includes a plan view (the upper part of the diagram) and a cross-sectional view (the lower part of the diagram) for describing a fourth step in the first method of manufacturing the solid-state imaging device

101. The cross-sectional view of FIG. 6D illustrates a cross section taken along the VI(D)-VI(D) line illustrated in the plan view of FIG. 6D.

After the oxide film OF is removed, portions of the oxide film OF that cover the back surface 1B and cover the bottom surface of the hole 11HZ1 are selectively removed by dry etching back as illustrated in FIG. 6E. As a result, only the portion of the oxide film OF that covers the side surface of the hole 11HZ1 remains as a sidewall SW. It is to be noted that FIG. 6E includes a plan view (the upper part of the diagram) and a cross-sectional view (the lower part of the diagram) for describing a fifth step in the first method of manufacturing the solid-state imaging device 101. The cross-sectional view of FIG. 6E illustrates a cross section taken along the VI(E)-VI(E) line illustrated in the plan view of FIG. 6E.

Next, as illustrated in FIG. 6F, a resist mask RM2 is formed that selectively covers the back surface 1B of the semiconductor substrate 1. The resist mask RM2 includes a photoresist material including, for example, a polymer as a principal component. The resist mask RM2 has an opening K2 at the position corresponding to the hole 11HZ1. It is assumed that the opening K2 has, for example, a substantially circular shape in a plan view. It is to be noted that FIG. 6F includes a plan view (the upper part of the diagram) and a cross-sectional view (the lower part of the diagram) for describing a sixth step in the first method of manufacturing the solid-state imaging device 101. The cross-sectional view of FIG. 6F illustrates a cross section taken along the VI(F)-VI(F) line illustrated in the plan view of FIG. 6F.

Subsequently, as illustrated in FIG. 6G, a portion of the Si {111} included in the semiconductor substrate 1 that is not covered with the resist mask RM2 and the sidewall SW, but exposed is dug by dry etching that uses the resist mask RM2 and the sidewall SW. This forms a hole 11HZ2 that finally serves as the hole 11H2. It is to be noted that FIG. 6G includes a plan view (the upper part of the diagram) and a cross-sectional view (the lower part of the diagram) for describing a seventh step in the first method of manufacturing the solid-state imaging device 101. The cross-sectional view of FIG. 6G illustrates a cross section taken along the VI(G)-VI(G) line illustrated in the plan view of FIG. 6G.

Further, the resist mask RM2 and the sidewall SW are removed as illustrated in FIG. 6H. As a result, a structure is exposed in which the hole 11HZ1 and the hole 11HZ2 are continuous. The sidewall SW is removed, for example, by wet etching. It is to be noted that it is sometimes possible to remove the sidewall SW by isotropic dry etching. In a case where the sidewall SW includes $SiO_2$, it is favorable to use a chemical solution containing, for example, HF (hydrofluoric acid) such as DHF (dilute hydrofluoric acid) or BHF (buffered hydrofluoric acid) in wet etching. In a case where the hard mask HM or the like includes SiN, it is favorable to use a chemical solution containing hot phosphoric acid (hot phosphoricacid) or HF. It is to be noted that FIG. 6H includes a plan view (the upper part of the diagram) and a cross-sectional view (the lower part of the diagram) for describing an eighth step in the first method of manufacturing the solid-state imaging device 101. The cross-sectional view of FIG. 6H illustrates a cross section taken along the VI(H)-VI(H) line illustrated in the plan view of FIG. 6H.

After the resist mask RM2 and the sidewall SW are removed, the operations corresponding to FIGS. 6D, 6E. 6F, and 6G described above are repeated. As a result, as illustrated in FIG. 6I, a hole 11HZ3 that finally serves as the hole 11H3 is formed and the structure is exposed in which the hole 11HZ1, the hole 11HZ2, and the hole 11HZ3 are continuous. However, as illustrated in the plan view in the upper part of FIG. 6I, the outlines of the holes 11HZ1 to 11HZ3 have substantially circular shapes at this stage. It is to be noted that FIG. 6I includes a plan view (the upper part of the diagram) and a cross-sectional view (the lower part of the diagram) for describing a ninth step in the first method of manufacturing the solid-state imaging device 101. The cross-sectional view of FIG. 6I illustrates a cross section taken along the VI(I)-VI(I) line illustrated in the plan view of FIG. 6I.

Next, a portion of the semiconductor substrate 1 near the back surface 1B is immersed in a predetermined alkaline aqueous solution and wet etching is performed to remove a portion of the Si {111} included in the semiconductor substrate 1. As the alkaline aqueous solution, an inorganic solution is applicable such as KOH, NaOH, or CsOH. An organic solution is applicable such as EDP (ethylenediamine pyrocatechol aqueous solution), $N_2H_4$ (hydrazine), $NH_4OH$ (ammonium hydroxide), or TMAH (tetramethyl ammonium hydroxide). Here, crystal anisotropic etching is performed that uses a property that the etching rate is different in accordance with the plane orientation of the Si {111}. Specifically, in a Si {111} substrate, the etching rate in the <110> direction or the direction with one or two Si back-bonds is sufficiently higher than the etching rate in the <111> direction or the direction with three Si backbonds. Accordingly, in the present embodiment, while etching propagates in the X axis direction, almost no etching propagates in the Y axis direction and the Z axis direction. As a result, as illustrated in FIG. 6J, it is possible to process the holes 11HZ1 to 11HZ3 each having a circular shape in a plan view into the holes 11H1 to 11H3 having the outlines 11K1 to 11K3 having substantially hexagonal shapes while keeping a multi-stepped shape in a cross-sectional view. It is to be noted that it is possible to adjust the propagation distance of etching in the <110> direction by using etching processing time for which an alkaline aqueous solution is used on the semiconductor substrate 1. However, providing an etching stopper at a predetermined position in advance makes it possible to easily control the propagation of etching in the <110> direction and accurately secure a region in which the Si {111} remains.

After the wet etching of the semiconductor substrate 1 described above, the corners on the stepped inner surface of the multi-stepped recess 11 may be rounded and the stepped inner surface of the multi-stepped recess 11 may be made a more planar slope by further performing chemical dry etching or isotropic wet etching.

Subsequently, the TRX 52, the TRM 53, the MEM 54, the TRG 55, and the OFG 57 are formed on the front surface 1A by using a known method. After that, the element separation sections are each formed at the position of the boundary between the sensor pixels 121. To form the element separation section, a trench is formed by dry etching or the like, for example, from the back surface 1B. After that, the optical material film 2 and the separation wall 3T are formed from the back surface 1B to fill the trench 13. The insulating film 3 may also be formed along with the formation of the separation wall 3T. Finally, the light shielding film 4, the planarization film 5, the color filters 6A to 6C, and the on-chip lens 7 are formed in order on the back surface 1B to complete the solid-state imaging device 101.

(Second Manufacturing Method)

Next, a second manufacturing method is described as an example of the method of manufacturing the solid-state imaging device 101 with reference to FIGS. 7A, 7B, 7C. 7D, 7E, and 7F. It is to be noted that a step of forming the multi-stepped recess 11 is described here.

FIG. 7A includes a plan view (the upper part of the diagram) and a cross-sectional view (the lower part of the diagram) for describing a first step in the second method of manufacturing the solid-state imaging device 101. The cross-sectional view of FIG. 7A illustrates a cross section taken along the VII(A)-VII(A) line illustrated in the plan view of FIG. 7A. First, as illustrated in FIG. 7A, after the semiconductor substrate 1 is prepared in which the photoelectric conversion section 51 and the like are each formed at a predetermined position, a resist mask RM3 is formed that selectively covers the back surface 1B. The resist mask RM3 includes a photoresist material including, for example, a polymer as a principal component. The resist mask RM3 has an opening K3 at a position on the back surface 1B at which the multi-stepped recess 11 is to be formed. It is assumed that the opening K3 has, for example, a substantially circular shape in a plan view.

Next, as illustrated in FIG. 7B, a portion of the Si {111} included in the semiconductor substrate 1 exposed in the opening K3 is dug by anisotropic dry etching that uses the resist mask RM3. This forms the hole 11HZ1 that finally serves as the hole 11H1. It is to be noted that FIG. 7B includes a plan view (the upper part of the diagram) and a cross-sectional view (the lower part of the diagram) for describing a second step in the second method of manufacturing the solid-state imaging device 101. The cross-sectional view of FIG. 7B illustrates a cross section taken along the VII(B)-VII(B) line illustrated in the plan view of FIG. 7B.

Next, as illustrated in FIG. 7C, a portion of the resist mask RM3 around the opening K3 is removed by isotropic dry etching to form a larger opening K3A. This exposes a portion of the back surface 1B in the peripheral region of the hole 11HZ1. It is to be noted that FIG. 7C includes a plan view (the upper part of the diagram) and a cross-sectional view (the lower part of the diagram) for describing a third step in the second method of manufacturing the solid-state imaging device 101. The cross-sectional view of FIG. 7C illustrates a cross section taken along the VII(C)-VII(C) line illustrated in the plan view of FIG. 7C.

Next, as illustrated in FIG. 7D, a portion of the Si {111} included in the semiconductor substrate 1 exposed in the opening K3A is dug by anisotropic dry etching that uses the resist mask RM3 including the opening K3A. This forms the hole 11HZ2 that finally serves as the hole 11H2. It is to be noted that FIG. 7D includes a plan view (the upper part of the diagram) and a cross-sectional view (the lower part of the diagram) for describing a fourth step in the second method of manufacturing the solid-state imaging device 101. The cross-sectional view of FIG. 7D illustrates a cross section taken along the VII(D)-VII(D) line illustrated in the plan view of FIG. 7D.

Next, as illustrated in FIG. 7E, a portion of the resist mask RM3 around the opening K3A is removed by isotropic dry etching to form a larger opening K3B. This exposes a portion of the back surface 1B in the peripheral region of the hole 11HZ1 again. It is to be noted that FIG. 7E includes a plan view (the upper part of the diagram) and a cross-sectional view (the lower part of the diagram) for describing a fifth step in the second method of manufacturing the solid-state imaging device 101. The cross-sectional view of FIG. 7E illustrates a cross section taken along the VII(E)-VII(E) line illustrated in the plan view of FIG. 7E.

Next, as illustrated in FIG. 7F, a portion of the Si {111} included in the semiconductor substrate 1 exposed in the opening K3B is dug by anisotropic dry etching that uses the resist mask RM3 including the opening K3B. This forms the hole 11HZ3 that finally serves as the hole 11H3. As a result, a structure is formed in which the hole 11HZ1, the hole 11HZ2, and the hole 11HZ3 are continuous. However, as illustrated in the plan view in the upper part of FIG. 7F, the outlines of the holes 11HZ1 to 11HZ3 have substantially circular shapes at this stage. It is to be noted that FIG. 7F includes a plan view (the upper part of the diagram) and a cross-sectional view (the lower part of the diagram) for describing a sixth step in the second method of manufacturing the solid-state imaging device 101. The cross-sectional view of FIG. 7F illustrates a cross section taken along the VII(F)-VII(F) line illustrated in the plan view of FIG. 7F.

Finally, a portion of the semiconductor substrate 1 near the back surface 1B is immersed in a predetermined alkaline aqueous solution and wet etching is performed to remove a portion of the Si {111} included in the semiconductor substrate 1 as with the first manufacturing method. As a result, the holes 11HZ1 to 11HZ3 each having a circular shape in a plan view serve as the holes 11H1 to 11H3 having the outlines 11K1 to 11K3 having substantially hexagonal shapes while keeping a multi-stepped shape in a cross-sectional view. As a result, as illustrated in FIG. 6J, it is possible to process the holes 11HZ1 to 11HZ3 each having a circular shape in a plan view into the holes 11H1 to 11H3 having the outlines 11K1 to 11K3 having substantially hexagonal shapes while keeping a multi-stepped shape in a cross-sectional view.

After the wet etching of the semiconductor substrate 1 described above, the corners on the stepped inner surface of the multi-stepped recess 11 may be rounded and the stepped inner surface of the multi-stepped recess 11 may be made a more planar slope by further performing chemical dry etching or isotropic wet etching.

[Workings and Effects of Solid-State Imaging Device 101]

In this way, the solid-state imaging device 101 according to the present embodiment is provided with the uneven structure 12 including the plurality of multi-stepped recesses 11 near the back surface 1B. The incident light passing through the multi-stepped recess 11 of the uneven structure 12 therefore enters the photoelectric conversion section 51. The uneven structure 12 including the plurality of multi-stepped recesses 11 forms a periodic pseudo-pyramidal structure and makes it possible to suppress reflection on the back surface 1B. In other words, it is possible to consider the stepped inner surface of the multi-stepped recess 11 as a smooth inclined surface for incident light having a shorter wavelength than the height (depth) of each step difference and it is possible to attain an anti-reflection effect against such incident light.

Further, the multi-stepped recess 11 has a configuration in which the plurality of holes 11H that forms the respective outlines 11K having substantially polygonal shapes different from each other in size in a plan view is linked in the Z axis direction. This allows the semiconductor substrate 1 to have a larger absorption amount of infrared light. This is because the outline 11K of the multi-stepped recess 11 has a substantially hexagonal shape in a plan view, but the outline 51K of the photoelectric conversion section 51 has a substantially rectangle shape including the outline 51K including a portion that is inclined with respect to the outline 11K. This increases the path length of light that is diffracted on the uneven structure 12 and passes from the back surface 1B serving as an incidence surface to the photoelectric conversion section 51. It is possible to increase the absorption amount of infrared light without increasing the thickness of the semiconductor substrate 1. The solid-state imaging device 101 according to the present embodiment thus makes it possible to achieve excellent imaging performance.

In addition, the outlines 11K of the plurality of holes 11H have substantially hexagonal shapes. This makes it possible to dispose the multi-stepped recesses 11 in the XY plane more precisely than in a case of other shapes. In other words, it is possible to dispose more multi-stepped recesses 11 for the one photoelectric conversion section 51. This makes it possible to effectively reduce the reflectance and effectively absorb infrared light.

In the method of manufacturing the solid-state imaging device 101 according to the present embodiment, a Si {111} substrate is used as the semiconductor substrate 1 and the hole 11H having the outline 11K having a substantially polygonal shape in a plan view is formed by crystal anisotropic etching that uses an etching solution. This makes it possible to relatively easily make the multi-stepped recess 11 having the plurality of holes 11H having the outlines 11K having substantially polygonal shapes with high accuracy.

In addition, the solid-state imaging device 101 according to the present embodiment is provided with the plurality of multi-stepped recesses 11 for the one photoelectric conversion section 51. This makes it possible to more effectively reduce the reflectance and more effectively absorb infrared light.

In addition, the solid-state imaging device 101 according to the present embodiment is provided with the respective separation walls 3T extending in the thickness direction in the inter-pixel regions between the plurality of adjacent photoelectric conversion sections 51 in the semiconductor substrate 1. This makes it possible to electrically insulate the adjacent sensor pixels 121 from each other and sufficiently prevent the crosstalk of pixel signals between the adjacent sensor pixels 121. As a result, it is possible to suppress noise such as a color mixture.

In addition, the solid-state imaging device 101 according to the present embodiment further includes the optical material film 2 that is provided to cover the inner surface of the multi-stepped recess 11 or provided to fill the multi-stepped recess 11. This makes it possible to further suppress reflection near the back surface 1B. In particular, the optical material film 2 has a lower refractive index than the refractive index of the semiconductor substrate 1. It is thus possible to further increase the anti-reflection performance.

Further, the Si {111} substrate is used as the semiconductor substrate 1 in the solid-state imaging device 101 according to the present embodiment. This offers higher channel mobility than the use of a Si (100) substrate does. It is possible to expect higher electric charge transfer characteristics.

In addition, in the method of manufacturing the solid-state imaging device 101 according to the present embodiment, crystal anisotropic etching that uses an alkaline aqueous solution on the Si {111} substrate is performed to form the multi-stepped recess 11. It is thus possible to obtain high controllability. Moreover, no recrystallization occurs, which is an issue with a method in which technology using selective Epi growth or an SON (Silicon On Nothing) technology is used. It is thus possible to avoid an adverse effect on the imaging performance.

2. Example of Application to Electronic Apparatus

FIG. 8 is a block diagram illustrating a configuration example of a camera 2000 serving as an electronic apparatus to which the present technology is applied.

The camera 2000 includes an optical unit 2001 including a lens group and the like, an imaging device (imaging device) 2002 to which the solid-state imaging device 101 or the like (referred to as solid-state imaging device 101 or the like below) described above is applied, and a DSP (Digital Signal Processor) circuit 2003 that is a camera signal processing circuit. In addition, the camera 2000 also includes a frame memory 2004, a display unit 2005, a recording unit 2006, an operation unit 2007, and a power supply unit 2008. The DSP circuit 2003, the frame memory 2004, the display unit 2005, the recording unit 2006, the operation unit 2007, and the power supply unit 2008 are coupled to each other through a bus line 2009.

The optical unit 2001 takes in incident light (image light) from a subject to form an image on an imaging surface of the imaging device 2002. The imaging device 2002 converts the amount of incident light formed as an image on the imaging surface by the optical unit 2001 into an electric signal on a pixel unit basis and outputs the converted electric signal as a pixel signal.

The display unit 2005 includes, for example, a panel display such as a liquid crystal panel or an organic EL panel and displays a moving image or a still image captured by the imaging device 2002. The recording unit 2006 records a moving image or a still image captured by the imaging device 2002 in a recording medium such as a hard disk or a semiconductor memory.

The operation unit 2007 issues an operation instruction about a variety of functions of the camera 2000 under an operation of a user. The power supply unit 2008 appropriately supplies the DSP circuit 2003, the frame memory 2004, the display unit 2005, the recording unit 2006, and the operation unit 2007 with various kinds of power for operations of these supply targets.

As described above, the use of the solid-state imaging device 101 or the like described above as the imaging device 2002 makes it possible to expect the acquirement of a favorable image.

3. Example of Practical Application to Mobile Body

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

FIG. 9 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 9, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 9, an audio speaker 12061, a display section 12062, and an instrument panel 12063 are illustrated as the output device. The display section 12062 may, for example, include at least one of an on-board display and a head-up display.

FIG. 10 is a diagram depicting an example of the installation position of the imaging section 12031.

In FIG. 10, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 10 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the vehicle control system to which the technology according to the present disclosure may be applied. The technology according to the present disclosure may be applied to the imaging section 12031 among the components described above. Specifically, for example, the solid-state imaging device 101 illustrated in FIG. 1 or the like is applicable to the imaging section 12031. It is possible to expect an excellent operation of the vehicle control system by applying the technology according to the present disclosure to the imaging section 12031.

4. Other Modification Examples

Although the present disclosure has been described above with reference to several embodiments and modification examples, the present disclosure is not limited to the embodiments and the like described above. It is possible to make a variety of modifications. For example, in the first embodiment described above, the case has been exemplified where a Si {111} substrate is used as a semiconductor substrate, but the present disclosure is not limited to this. It is possible to use, for example, a substrate such as a Si {110} substrate including another semiconductor material as the semiconductor substrate according to the present disclosure. In a case where a semiconductor substrate other than a Si {111} substrate is used, it is sufficient if a resist mask including a plurality of openings having substantially hexagonal shapes is formed, for example, to cover the back surface of the semiconductor substrate, dry etching that uses the resist mask is performed, and holes having substantially hexagonal shapes are hereby formed to form a multi-stepped recess.

In addition, the embodiment described above, the outline of a hole of a multi-stepped recess in a plan view has a substantially regular hexagonal shape, but the present disclosure is not limited to this. For example, as illustrated in FIGS. 11A, 11B, and 11C, the multi-stepped recess may have holes 21H and 22H having outlines 21K and 22K having substantially octagonal shapes or a hole 23H having an outline 23K having a substantially hexagonal shape that is substantially similar to an equilateral triangle.

Alternatively, as illustrated in FIG. 11D, a multi-stepped recess may have a hole 24H having an outline 24K having a shape obtained by arranging two substantially rhombic shapes. In a case where a Si {111} substrate is used as a semiconductor substrate, the hole 21H in FIG. 11A and the hole 22H in FIG. 11B are respectively obtained by forming, for example, holes 21HZ and 22HZ having cross shapes by dry etching and then processing the holes 21HZ and 22HZ by wet etching similar to that of the embodiment described above. In addition, the hole 23H in FIG. 11C is obtained by forming, for example, a hole 23HZ including portions extending in three directions by dry etching and then processing the hole 23HZ by wet etching similar to that of the embodiment described above. Further, the hole 24H in FIG. 11D is obtained by forming, for example, a hole 24HZ including an outline having an annular rectangular shape by dry etching and then processing the hole 24HZ by wet etching similar to that of the embodiment described above.

Further, in the embodiment described above, to form the hole 11H including the outline 11K having a substantially hexagonal shape, a hole 11HZ having a substantially circular shape is processed by wet etching, but the present disclosure is not limited to this. For example, as respectively illustrated in FIGS. 12A, 12B, and 12C, holes 25HZ to 27HZ having rectangular shapes may be formed by dry etching and the holes 25HZ to 27HZ may be then processed by wet etching similar to that of the embodiment described above to offer the respective holes 11H having substantially hexagonal shapes. In addition, for example, as illustrated in FIG. 13, a hole 28HZ shaped like an alphabet I may be formed by dry etching and the hole 28HZ may be then processed by wet etching similar to that of the embodiment described above to offer the hole 11H having a substantially hexagonal shape.

Further, in the embodiment described above, the whole of the inside of the multi-stepped recess 11 is filled with the optical material film 2, but the present disclosure is not limited to this. For example, as illustrated in FIG. 14A, an optical material film 2A having a substantially uniform thickness may be formed along the stepped inner surface of the multi-stepped recess 11. In this case, the optical material film 2A is also formed to have steps. It is thus considered that the path length of light which is diffracted by the uneven

22 the [101] direction, the [011] direction, the [−110] direction, the [1−10] direction, the [−101] direction, the [10−1] direction, the [0−11] direction, the [01−1] direction, the [−1−10] direction, the [−10−1] direction, and the [0−1−1] direction, which are crystal plane directions equivalent to each other in terms of symmetry. The <110> direction may also be read as any of the above. In the present disclosure, however, etching is performed in the direction orthogonal to an element formation surface and the direction further orthogonal to this direction orthogonal to the element formation surface (i.e., the direction parallel with the element formation surface).

Table 1 exhibits specific combinations of planes and orientations in which etching in the <110> direction is established in the {111} plane that is the crystal plane of the Si {111} substrate in the present disclosure.

TABLE 1

| etching orientation | element formation surface | | | | | | | |
|---|---|---|---|---|---|---|---|---|
| | (111) | (-111) | (1-11) | (11-1) | (-1-11) | (-11-1) | (1-1-1) | (-1-1-1) |
| [110] | | ○ | ○ | | | ○ | ○ | |
| [101] | | ○ | | | | | ○ | |
| [011] | | | ○ | ○ | ○ | ○ | | |
| [-110] | ○ | | | ○ | ○ | | | ○ |
| [1-10] | ○ | | | ○ | ○ | | | ○ |
| [-101] | ○ | | ○ | | | ○ | | ○ |
| [10-1] | ○ | | ○ | | | ○ | | ○ |
| [0-11] | ○ | ○ | | | | | ○ | ○ |
| [01-1] | ○ | ○ | | | | | ○ | ○ |
| [-1-10] | | ○ | ○ | | | ○ | ○ | |
| [-10-1] | | ○ | | ○ | ○ | | ○ | |
| [0-1-1] | | | ○ | ○ | ○ | ○ | | | structure 12 including the multi-stepped recess 11 and passes from the back surface 1B serving as an incidence surface to the photoelectric conversion section 51 is further increased. It is therefore considered possible to further increase the absorption amount of infrared light without increasing the thickness of the semiconductor substrate 1. It is to be noted that, for example, as illustrated in FIG. 14B, the whole of the hole 11H3 of the multi-stepped recess 11 may be filled with an optical material film 2B in this case.

The Si {111} substrate according to the present disclosure refers to a substrate or a wafer including a silicon single crystal and having a crystal plane represented by {111} in the Miller index notation. The Si {111} substrate according to the present disclosure also includes a substrate or a wafer having a crystal orientation shifted by several degrees. For example, the crystal orientation is shifted by several degrees from the {111} plane in the nearest [110] direction. Further, the Si {111} substrate also includes a silicon single crystal grown on a portion or the whole of a surface of this substrate or this wafer in an epitaxial method or the like.

In addition, in the notation of the present disclosure, the {111} plane is a generic term of the (111) plane, the (−111) plane, the (1−11) plane, the (11−1) plane, the (−1−11) plane, the (−11−1) plane, the (1−1−1) plane, and the (−1−1−1) plane, which are crystal planes equivalent to each other in terms of symmetry. Accordingly, the description of the Si {111} substrate in the specification or the like of the present disclosure may also be read, for example, as a Si (1−11) substrate. Here, a bar sign of the Miller index for expressing an index in the negative direction is substituted with a minus sign.

In addition, the <110> direction in the description of the present disclosure is a generic term of the [110] direction, As illustrated in Table 1, there are 96 (=8×12) combinations of the {111} planes and the <110> directions. However, the <110> direction according to the present disclosure is limited to the direction orthogonal to the {111} plane that is an element formation surface and the direction parallel with the element formation surface. In other words, a combination of the element formation surfaces of the Si {111} substrate according to the present disclosure and the orientations in which the etching is performed on the Si {111} substrate is selected from any of the combinations indicated by ○ in Table 1.

In addition, in the first embodiment described above, the case has been exemplified where the Si {111} substrate is used to cause the etching to progress in the X axis direction, but the etching does not progress in the Y axis direction or the Z axis direction. The present disclosure is not, however, limited to this. It is sufficient if the etching progress orientation includes both the X axis direction and the Y axis direction or any one of the X axis direction or the Y axis direction. In addition, the Si {111} substrate also includes a substrate whose front surface is processed to have an off angle in the <112> direction, for example, as illustrated in FIG. 15. In a case where the off angle is 19.47° or less, even a substrate having an off angle maintains a relationship in which the etching rate in the <110> direction or the direction with one Si backbond is sufficiently higher than the etching rate in the <111> direction or the direction with three Si backbonds. A larger off angle causes the number of steps to increase. This increases the density of micro step differences. It is thus preferable that the off angle be 5° or less. It is to be noted that the case where the substrate front surface has an off angle in the <112> direction has been described in the example of FIG. 33, but the substrate front surface may have an off angle in the <110> direction. It does not matter which direction the off angle is in. In addition, the Si plane orientation is analyzable by using an X-ray diffraction method, an electron beam diffraction method, an electron beam backscatter diffraction method, or the like. The number of Si backbonds is determined by the Si crystal structure and the number of backbonds is thus also analyzable by analyzing the Si plane orientation.

In the imaging device and the electronic apparatus according to the respective embodiments of the present disclosure, the photoelectric conversion section receives and photoelectrically converts incident light passing through the multi-stepped recess that forms an outline having a substantially polygonal shape. This makes it possible to effectively absorb infrared light while suppressing reflection on the light incidence surface. It is therefore possible to achieve imaging performance that offers excellent sensitivity characteristics in the visible light range. In addition, the method of manufacturing the imaging device according to the embodiment of the present disclosure makes it possible to efficiently manufacture the imaging device described above.

It is to be noted that the effects described in this specification are merely illustrative, but not limited to the description. There may be other effects. In addition, the present technology may have configurations as follows.

(1)

An imaging device including:

a semiconductor substrate including a multi-stepped recess in which a plurality of respective holes defined by first outlines having substantially polygonal shapes is continuous in a thickness direction, the substantially polygonal shapes extending along a first surface orthogonal to the thickness direction and being different from each other in size in a plan view taken along the thickness direction; and a photoelectric conversion section that generates electric charge through photoelectric conversion, the photoelectric conversion section being defined by a second outline including a portion inclined with respect to the first outlines of the holes in a plan view, the electric charge corresponding to an amount of incident light passing through the multi-stepped recess.

(2)

The imaging device according to (1), in which the photoelectric conversion section is buried in the semiconductor substrate.

(3)

The imaging device according to (1) or (2), in which the semiconductor substrate includes a Si {111} substrate having a first crystal plane represented by a plane index {111}, the first crystal plane extending along the first surface.

(4)

The imaging device according to any one of (1) to (3), in which a plurality of the multi-stepped recesses is provided for the one photoelectric conversion section.

(5)

The imaging device according to any one of (1) to (4), in which the plurality of photoelectric conversion sections is disposed along the first surface, and separation walls extending in the thickness direction are each provided in an inter-pixel region between the plurality of adjacent photoelectric conversion sections in the semiconductor substrate.

(6)

The imaging device according to any one of (1) to (5), further including an anti-reflection film that is provided to cover an inner surface of the multi-stepped recess or provided to fill the multi-stepped recess.

(7)

The imaging device according to (6), in which a refractive index of the anti-reflection film is lower than a refractive index of the semiconductor substrate.

(8)

The imaging device according to any one of (1) to (7), in which the first outlines of the plurality of holes have substantially hexagonal shapes.

(9)

The imaging device according to any one of (1) to (8), in which a plurality of the multi-stepped recesses is disposed adjacent to each other along the first surface.

(10)

An electronic apparatus including an imaging device, in which the imaging device includes a semiconductor substrate including a multi-stepped recess in which a plurality of respective holes defined by first outlines having substantially polygonal shapes is continuous in a thickness direction, the substantially polygonal shapes extending along a first surface orthogonal to the thickness direction and being different from each other in size in a plan view taken along the thickness direction, and a photoelectric conversion section that generates electric charge through photoelectric conversion, the photoelectric conversion section being defined by a second outline including a portion inclined with respect to the first outlines of the holes in a plan view, the electric charge corresponding to an amount of incident light passing through the multi-stepped recess.

(11)

A method of manufacturing an imaging device, the method including:

preparing a Si {111} substrate having a first crystal plane represented by a plane index {111}, the first crystal plane extending along a first surface orthogonal to a thickness direction;

forming a photoelectric conversion section in the Si {111} substrate, the photoelectric conversion section generating electric charge through photoelectric conversion, the electric charge corresponding to an amount of received light; and forming a hole by performing crystal anisotropic etching on the Si {111} substrate and forming the first crystal plane of the Si {111} substrate represented by the plane index {111} and a second crystal plane of the Si {111} substrate represented by the plane index {111}, the crystal anisotropic etching using an etching solution, the first crystal plane being orthogonal to the thickness direction, the second crystal plane being inclined with respect to the thickness direction, the hole including a first surface along the first crystal plane and a second surface along the second crystal plane and forming an outline having a substantially polygonal shape in a plan view taken along the thickness direction.

The present application claims the priority on the basis of Japanese Patent Application No. 2019-208122 filed on Nov. 18, 2019 with Japan Patent Office, the entire contents of which are incorporated in the present application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device, comprising:
a semiconductor substrate including:
a multi-stepped recess in which a plurality of holes defined by first outlines is continuous in a thickness direction of the semiconductor substrate, wherein
the first outlines have substantially polygonal shapes extending along a surface of the semiconductor substrate,
the surface is orthogonal to the thickness direction, and
each of the substantially polygonal shapes has a different size in a first plan view taken along the thickness direction; and
a Si {111} substrate having a crystal plane represented by a plane index {111},
wherein the crystal plane extends along the surface; and
a photoelectric conversion section configured to generate electric charge by photoelectric conversion of an amount of incident light that passes through the multi-stepped recess,
wherein the photoelectric conversion section is defined by a second outline including a portion inclined with respect to the first outlines of the plurality of holes in a second plan view.

2. The imaging device according to claim 1, wherein the photoelectric conversion section is in the semiconductor substrate.

3. The imaging device according to claim 1, wherein
the semiconductor substrate further includes a plurality of multi-stepped recesses for the photoelectric conversion section, and
the plurality of multi-stepped recesses includes the multi-stepped recess.

4. The imaging device according to claim 1, further comprising:
a plurality of photoelectric conversion sections along the surface,
wherein the plurality of photoelectric conversion sections includes the photoelectric conversion section; and
separation walls extending in the thickness direction, wherein each of the separation walls is in a corresponding inter-pixel region between adjacent photoelectric conversion sections of the plurality of photoelectric conversion sections.

5. The imaging device according to claim 1, further comprising an anti-reflection film that one of covers an inner surface of the multi-stepped recess, or fills the multi-stepped recess.

6. The imaging device according to claim 5, wherein a refractive index of the anti-reflection film is lower than a refractive index of the semiconductor substrate.

7. The imaging device according to claim 1, wherein the first outlines of the plurality of holes have substantially hexagonal shapes.

8. The imaging device according to claim 1, wherein
the semiconductor substrate further includes a plurality of adjacent multi-stepped recesses along the surface, and
the plurality of adjacent multi-stepped recesses includes the multi-stepped recess.

9. An electronic apparatus, comprising:
an imaging device that includes:
a semiconductor substrate including:
a multi-stepped recess in which a plurality of holes defined by first outlines is continuous in a thickness direction of the semiconductor substrate, wherein
the first outlines have substantially polygonal shapes extending along a surface of the semiconductor substrate,
the surface is orthogonal to the thickness direction, and
each of the substantially polygonal shapes has a different size in a first plan view taken along the thickness direction; and
a Si {111} substrate having a crystal plane represented by a plane index {111},
wherein the crystal plane extends along the surface; and
a photoelectric conversion section configured to generate electric charge by photoelectric conversion of an amount of incident light that passes through the multi-stepped recess,
wherein the photoelectric conversion section is defined by a second outline including a portion inclined with respect to the first outlines of the plurality of holes in a second plan view.

* * * * *